US006889164B2

(12) United States Patent
Okuda

(10) Patent No.: US 6,889,164 B2
(45) Date of Patent: May 3, 2005

(54) METHOD AND APPARATUS OF DETERMINING DEFECT-FREE SEMICONDUCTOR INTEGRATED CIRCUIT

(75) Inventor: Yukio Okuda, Kanagawa (JP)

(73) Assignee: Sony Corporation (JP)

( * ) Notice: Subject to any disclaimer, the term of this patent is extended or adjusted under 35 U.S.C. 154(b) by 456 days.

(21) Appl. No.: 09/964,540

(22) Filed: Sep. 28, 2001

(65) Prior Publication Data
US 2002/0060584 A1 May 23, 2002

(30) Foreign Application Priority Data
Oct. 2, 2000 (JP) .................................... P2000-302780

(51) Int. Cl.[7] .............................................. G01R 31/26
(52) U.S. Cl. .......................... 702/183; 702/58; 324/765
(58) Field of Search ............................. 702/58, 64, 118, 702/179, 183, 57; 324/763, 765, 158.1, 731; 714/736

(56) References Cited

U.S. PATENT DOCUMENTS

| 5,332,973 | A | * | 7/1994 | Brown et al. ................ 324/537 |
| 5,392,293 | A | | 2/1995 | Hsue |
| 5,519,333 | A | | 5/1996 | Righter |
| 5,889,408 | A | * | 3/1999 | Miller ......................... 324/765 |
| 5,914,615 | A | | 6/1999 | Chess |
| 6,175,244 | B1 | * | 1/2001 | Gattiker et al. .......... 324/158.1 |
| 6,342,790 | B1 | * | 1/2002 | Ferguson et al. ............ 324/765 |

FOREIGN PATENT DOCUMENTS

| JP | 8-271584 | 10/1996 |
| JP | 9-211088 | 8/1997 |
| JP | 2000-171529 | 6/2000 |

OTHER PUBLICATIONS

M.C. Johnson, D. Somasekhar, and K. Roy, "Models and Algorithms for Bounds on Leakage in CMOS Circuits", IEEE Tran. CAD IC Sys., vol. 18, No. 6, pp. 714–725, Jun. 1999.
A. Ferre and J. Figueras, "On Estimating Bounds of the Quiescent Power Supply Current for IDDQ Testing", VLSI Test Sym., pp. 106–111, IEEE, 1996.
P.C. Maxwell and J.R. Rearick, "Estimation of Defect–Free IDDQ in Submicron Circuits Using Switch Level Simulation", Int. Test Conf., pp. 882–889, IEEE, 1998.
A. Gattiker and W. Mary, "Current Signatures", VLSI Test Sym., pp. 112–117, IEEE, 1996.
C. Thibeault, "On the Comparison of IDDQ and IDDQ Testing", VLSI Test Sym., pp. 143–150, IEEE, 1999.
T.W. Williams, R.H. Dennard, R. Kapur, M.R. Mercer, W. Maly, "Iddq Test: Sensitivity Analysis of Scaling," Int. Test Conf., pp. 786–792, Oct. 1996.

(Continued)

Primary Examiner—Marc S. Hoff
Assistant Examiner—Paul L Kim
(74) Attorney, Agent, or Firm—Rader, Fishman & Grauer PLLC; Ronald P. Kananen

(57) ABSTRACT

A method of and apparatus for determining a defect-free semiconductor integrated circuit, such as a CMOS IC. The method includes a measurement step of selecting a defect-free CMOS integrated circuit (IC) from a group of CMOS integrated circuits by measuring quiescent power supply current (QPSC), a step of successively inspecting a test IC and the reference defect-free IC for resemblance for QPSCs, and a comparison and determination step of determining resemblance between QPSC data so that when the resemblance is high, the first and second ICs are determined to be defect-free ICs, and when the resemblance is low, the first and second ICs are determined to be defective ICs. The apparatus performs at least those steps.

30 Claims, 20 Drawing Sheets

OTHER PUBLICATIONS

A. Gattiker and W. Maly, "Toward Understanding: Iddq–Only Fails," Department of ECE, Carnegie Mellon University, Pittsburgh, PA.

A. Keshavarzi, C. Hawkins, K. Roy, and V. De, "Effectiveness of Reverse Body Bias for Low Power CMOS Circuits," Microprocessor Research Labs, The University of New Mexico, and Purdue University, Intel Corporation, Hillsboro, OR 97124, USA.

A. Keshavarzi, K. Roy, and C. Hawkin, "Intrinsic Leakage in LOw Power Deep Submicron CMOS Ics".

* cited by examiner

FIG. 15

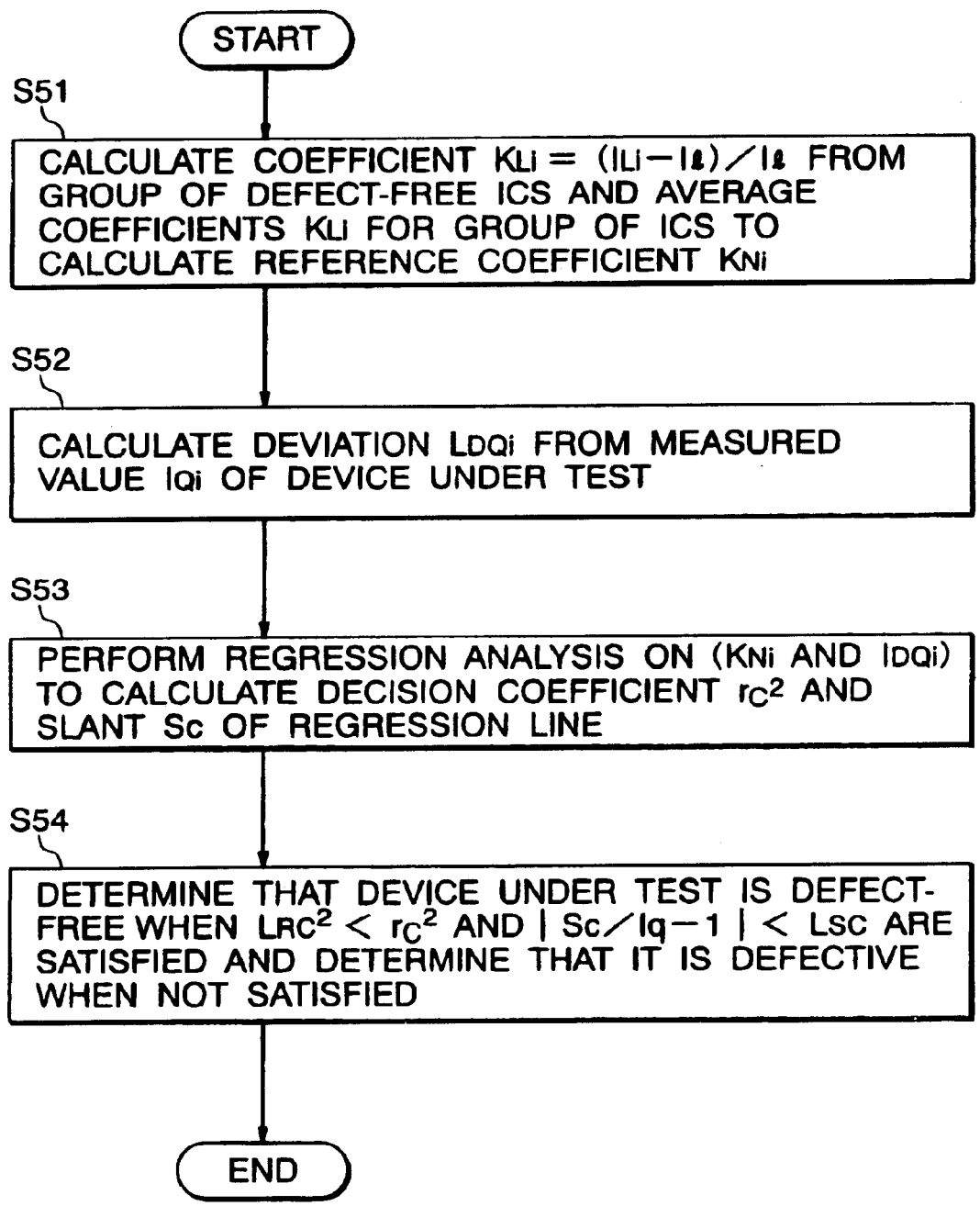

- START
- S51: CALCULATE COEFFICIENT $K_{Li} = (I_{Li} - I_t)/I_t$ FROM GROUP OF DEFECT-FREE ICS AND AVERAGE COEFFICIENTS $K_{Li}$ FOR GROUP OF ICS TO CALCULATE REFERENCE COEFFICIENT $K_{Ni}$
- S52: CALCULATE DEVIATION $L_{DQi}$ FROM MEASURED VALUE $I_{Qi}$ OF DEVICE UNDER TEST
- S53: PERFORM REGRESSION ANALYSIS ON ($K_{Ni}$ AND $I_{DQi}$) TO CALCULATE DECISION COEFFICIENT $r_c^2$ AND SLANT $S_c$ OF REGRESSION LINE
- S54: DETERMINE THAT DEVICE UNDER TEST IS DEFECT-FREE WHEN $L_{Rc}^2 < r_c^2$ AND $|S_c/I_q - 1| < L_{Sc}$ ARE SATISFIED AND DETERMINE THAT IT IS DEFECTIVE WHEN NOT SATISFIED
- END

METHOD AND APPARATUS OF DETERMINING DEFECT-FREE SEMICONDUCTOR INTEGRATED CIRCUIT

BACKGROUND OF THE INVENTION

1. Field of the Invention

The present invention relates to a method of determining a defect-free semiconductor integrated circuit such as complementary metal oxide semiconductor (CMOS) integrated circuit.

2. Description of the Related Art

Many of semiconductor integrated circuits (ICs;) are simultaneously formed on a semiconductor wafer by a same design rule, and in same production conditions. However, all of the ICs are always defect-free, and the inspection for the ICs is required. Many inspection methods have been proposed.

Japanese Unexamined Patent Publication (Kokai) No. 8-271584, Japanese Unexamined Patent Publication (Kokai) No. 9-211088, U.S. Pat. Nos. 5,392,293, 5,519,333, and 5,889,408 describe a quiescent power supply current (QPSC, $I_{DDQ}$) of a CMOS integrated circuit which is a test using an $I_{DDQ}$ In an $I_{DDQ}$ test, the measurement of the quiescent power supply current of a CMOS integrated circuit (IC) is carried out and the determination of defective or indefectible (defect-free) CMOS integrated circuit is carried out based on the measured value. Note that the CMOS integrated circuit to be tested is also called a "IC device under test" (DUT).

The quiescent power supply current $I_{DDQ}$ may include a leakage current flowing even in a defect-free (indefectible) device called "an intrinsic leakage current" or "a normal leakage current") and a defect current occurring due to a defect in the DUT. That is, the quiescent power supply current $I_{DDQ}$ is defined as the total of the normal leakage current and the defect current.

The normal leakage current can be expressed by the total of the leakage current (FET leakage current) generated from the structure of the metal oxide semiconductor field effect: transistors (MOSFETs) and the leakage current (circuit leakage current) occurring due to circuit operation. The circuit leakage current may be generated by analog circuits, pull-up circuits, bus collision, etc.

In an $I_{DDQ}$ test measuring the quiescent power supply current of a CMOS integrated circuit (IC) device and determining an IC device to be defective when the measured value is more than a threshold value, as described in T. W. Williams, R. H. Dennard, and R. Kapur, "Iddq Test: Sensitivity Analysis of Scaling", in *Int. Test Conf., pp.* 786–792, IEEE, 1996, accurate determination is sometimes difficult. The reason is, for example, when the interconnection patterns in an CMOS integrated circuit are extremely fine, the leakage current of the MOSFETs (FET leakage current) increases exponentially along with the fineness. Therefore, various methods have been proposed to reduce the FET leakage current during an $I_{DDQ}$ test.

As a method for reducing the FET leakage current during an $I_{DDQ}$ test, there is known the method of lowering the threshold value by lowering the FET leakage current when strobing. As such the method, a low power supply voltage method, low temperature measurement method, and well bias method are known.

Low Power Supply Voltage Method

This method is a reduction method by utilizing the fact that the leakage current falls when the power supply voltage $V_D$ is lowered. In this method, however, the lowering of the power supply voltage $V_D$ is limited to an extent where no circuit malfunction occurs, so the rate of reduction of the FET leakage current is low. Also, raising or lowering the power supply voltage $V_D$ before and after strobing takes several milliseconds (msec), so it takes a long test time, as a result, the cost increases along with this increase in the testing time.

According to A. E. Gattiker and W. Maly, "Toward Understanding 'Iddq-Only' Fails", in *Int. Test Conf.*, pp. 174–183, IEEE, 1998, a failure pass-through current may disappear when the power supply voltage $V_D$ is lowered, and the test may not be achieved.

Low Temperature Measurement Method

This method is a reduction method by using the fact that the FET leakage current falls when the operating temperature is lowered.

The lower limit temperature is determined by the guarantee of reliability and the costs of a temperature apparatus system for maintaining a low temperature and the test apparatus, but with consumer use temperature apparatuses for maintaining low temperatures, about 0° C. is the limit, as the rate of reduction of the FET leakage current is low. Further, the expense and running costs of the temperature apparatus are high, so the total test cost rises.

Well Bias Method

The well bias method is described in A. Keshavarzi, K. Roy, and C. F. Hawkins, "Intrinsic Leakage in Low Power Deep Submicron CMOS ICs", in *Int. Test Conf.*, pp. 146–155, IEEE, 1997.

In this reduction method, wiring for supplying the bias voltage is added, so the chip area of the CMOS integrated circuit increases or the integration may be low.

Further, the rate of reduction of the leakage current in this method is strongly dependent on the variability of the effective gate length Leff, so the FET leakage current may be varied along with miniaturization.

Note that A. Keshavarzi, C. F. Hawkins, K. Roy, and V. De, "Effectiveness of Reverse Body Bias for Low Power CMOS Circuits", in *8th NASA Symposium on VLSI Design*, pp. 2.3.1–2.3.9, October 1999, the rate of reduction is ⅕ when the effective gate length Leff is 0.18 μm, while the rate of reduction is ½ when the effective gate length Leff is 0.13 μm.

As a test method for a CMOS integrated circuit, in addition to test methods using a fixed threshold value, there are known the Delta method and current ratio method.

Delta Method

The Delta method is described in A. C. Miller, "Delta $I_{DDQ}$ Testing", in U.S. Pat. No. 5,889,408, March 1999. In this method, the test is conducted while providing an upper limit on the difference between the minimum value and maximum value of the $I_{DDQ}$. Since upper limit values are not set individually for CMOS integrated circuits, the overlooked defect current may be large. Further, a defect current of an extent less than the amount of fluctuation between vector points (measurement points) of the normal leakage current may not be detected.

Current Ratio Method

The current ratio method is disclosed in Japanese Unexamined Patent Publication (Kokai) No. 2000-171529. In this method, the test is conducted while making the ratio of the minimum value and maximum value of the $I_{DDQ}$ a fixed ratio and setting an upper limit, so an overlooked defect current may occur due to the defect current occurring at all vector points. Further, sometimes it is not possible to detect a defect current of an extent less than the amount of fluctuation between vector points of the normal leakage current.

Note, the power supply current of a CMOS integrated circuit can be divided into a transient current at the time of switching and a quiescent current at the time of quiescence. In an $I_{DDQ}$ test, generally the quiescent current at the time of quiescence is measured to determine defective or indefectible (defect-free) of the CMOS integrated circuit.

In the $I_{DDQ}$ tests of the related art, it is assumed that the $I_{DDQ}$ is the leakage current (FET leakage current) in the FETs.

In recent years, it has become important to integrate a plurality of devices of different designs on a single chip in order to reduce the size of portable devices and reduce costs through integration.

Therefore, a need has arisen for $I_{DDQ}$ testing a CMOS integrated circuit with a circuit(s) having a current(s) (circuit leakage current(s)) due to pull-up, pull-down, and bus collision.

SUMMARY OF THE INVENTION

An object of the present invention is to provide a method and apparatus of determining a defect-free semiconductor integrated circuit able to determine a defective or indefectible (defect-free) circuit regardless of the existence of a circuit leakage current.

According to a first aspect of the present invention, there is provided a method of determining a defect-free or defect semiconductor integrated circuit, comprising: a first measurement step for measuring a quiescent power supply current (QPSC) of a first semiconductor integrated circuit (IC), a plurality of times in a predetermined interval after stop of the operation of the first IC; a first data calculation step for calculating a first feature data indicating a feature(s) of the measured QPSCs of the first IC; a second measurement step for measuring a QPSC of a second semiconductor IC, a plurality of times in the same condition to that of the first IC after stop of the operation of the second IC; a second data calculation step for calculating a second feature data indicating a feature(s) of the measured QPSCs of the second IC; and a. comparison and determination step for comparing a resemble between the first feature data and the second feature data, and determining the first and second ICs as defect-free ICs when the resemble is high or the first and second ICs as defect ICs when the resemble is low.

The first and second ICs may be formed on the same semiconductor wafer.

Preferably, the IC comprises a complementary metal oxide semiconductor (CMOS) IC, preferably, one of the first and second ICs is decided as a reference IC, the second measurement step and the second calculation step are carried out for other semiconductor IC as the second IC, in the comparison and determination step, the second IC is determined as a defect-free IC when the resemble is high, or as a defect IC when the resemble is low.

Preferably, in the first data calculation step, a first average QPSC of the measured QPSCs of the first IC and a first plurality of QPSC deviations of the measured. QPSCs of the first IC which are (measured QPSCs of the first IC–the first average) are calculated, and in the second data calculation step, a second average QPSC of the measured QPSCs of the second IC and a second plurality of QPSC deviations of the measured QPSCs of the second IC which are (the measured QPSCs of the second IC–the second average) are calculated. The method may further comprise a third data calculation step for performing a first regression analysis on the first plurality of QPSC deviations and the second plurality of QPSC deviations to produce a first regression line and calculating a gradient of the first regression line, performing a second regression analysis on the measured QPSCs of the first IC to produce a second regression line and calculating a predicted QPSC, and calculating a decision coefficient defined by the following formula.

$$1 - \frac{\sum (\text{measured } QPSCs \text{ of the second } IC - \text{predicted } QPSC)^2}{\sum (\text{second deviation})^2}$$

In the comparison and determination step, the first and second ICs are resemble when the decision coefficient is greater than a limit value, and the deviation of the gradient and the ratio is in a predetermined range.

Alternatively, in the first data calculation step, a first average QPSC of the measured QPSCs of the first IC, a first standard deviation of the measured QPSCs of the first IC, and first normalized values defined as (the measures QPSCs of the first IC–the first average)/the first standard deviation are calculated, and in the second data calculation step, a second average of the measured QPSCs of the second IC, a second standard deviation of the measured QPSCs of the first IC, and second normalized values defined as (the measures QPSCs of the second IC–the second average)/the second standard deviation are calculated. The method may further comprise a third data calculation step for performing a first regression analysis on the first plurality of normalized values and the second plurality of normalized values to produce a first regression line and calculating a gradient of the first regression line, performing a second regression analysis on the first normalized values to produce a second regression line and calculating a predicted normalized value, calculating an average normalized value of the second plurality of normalized values, and calculating a decision coefficient defined by the following formula.

$$1 - \frac{\sum (\text{second standard values} - \text{predected standard value})^2}{\sum (\text{second standard values} - \text{average standard value})^2}$$

In the comparison and determination step, the first and second ICs are resemble when the decision coefficient is greater than a limit value, and the gradient is in a predetermined range.

Alternatively, in the first data calculation step, a first average QPSC of the measured QPSCs of the first IC, a first standard deviation of the measured QPSCs of the first IC, and a first feature value defined by (the first average QPSC/ the first standard deviation) are calculated, in the second data calculation step, a second average QPSC of the measured QPSCs of the second IC, a second standard deviation of the measured QPSCs of the second IC, and a second feature value defined by (the second average QPSC/the second standard deviation) are calculated, and in the comparison and determination step, the first and second ICs are resemble when the first and second feature values are in a predetermined range.

Alternatively, in the first data calculation step, a first average QPSC of the measured QPSCs of the first IC, first QPSC deviations which are (the measured QPSCs of the first IC–the first average QPSC), and first feature values defined by (the first QPSC deviations/the first QPSC) are calculated, the second data calculation step, a second average QPSC of the measured QPSCs of the second IC, second QPSC deviations which are the measured QPSCs of the second IC–the second average QPSC, and second feature values defined by (the second QPSC deviations/the second QPSC average) are calculated, in the comparison and determination step, the first and second ICs are resemble when the first and second feature data are in a predetermined range.

According to a second aspect of the present invention, there is provided a method of determining a defect-free or defect semiconductor integrated circuit, comprising: a first measurement step for measuring each quiescent power supply current (QPSC) of each of a plurality of reference semiconductor integrated circuits (ICs), a plurality of times in a predetermined interval after stop of the operation of the first IC; a first data calculation step for calculating each first QPSC average of measured QPSCs of each reference IC, each first standard deviation of the measured QPSCs of each reference IC, each of first normalized values defined by ((the measured QPSCs–the corresponding first QPSC average)/ the corresponding first standard deviation), each of first average normalized value of each of first normalized values, each of first feature value defined by ((each of the measured QPSCs–the corresponding each first QPSC average)–(the corresponding each first normalized values/the corresponding each first standard deviation)), and the maximum feature value among the first feature values; a second measurement step for measuring a QPSC of a test IC a plurality of times in the same conditions to the reference ICs after stop of the operation of the test IC; a second data calculation step for calculating a second QPSC average of measured QPSCs of the test IC, a second standard deviation of the measured QPSCs of the test IC, second normalized values defined by ((the measured QPSCs of the test IC–the second QPSC average)/the second standard deviation), a second average normalized value of the second normalized values, and second feature values defined by ((the measured QPSCs of the test IC–the second average QPSC) –(the second normalized values/the second standard deviation)); a comparison and determination step for comparing the second feature value and the maximum feature value and determining the test IC as a defect-free IC when the second feature values is smaller than the maximum feature value or a defect IC when one of the second feature values exceeds the maximum feature value.

According to a third aspect of the present invention, there is provided a method of determining a defect-free or defect semiconductor integrated circuit, comprising: a first measurement step for measuring a quiescent power supply current (QPSC) of a reference semiconductor integrated circuit (IC), a plurality of times in a predetermined interval after stop of the operation of the reference IC; a first data calculation step for calculating a first standard deviation of measured QPSCs of the reference IC; a second measurement step for measuring a QPSC of a test IC a plurality of times in the same condition of that of the reference IC after stop of the operation of the test IC; a second data calculation step for calculating a QPSC average and a second standard deviation of measured QPSCs of the test IC, and a comparison and determination step for comparing a parameter which is ((QPSC average–(the second standard deviation/ the first standard deviation)) and a limit and determining the test IC as a defect-free IC when the parameter is smaller than the limit or the test IC as a defect IC when the parameter is equal or greater than the limit.

According to a fourth aspect of the present invention, there is provided a method of determining a defect-free or defect semiconductor integrated circuit, comprising: a first measurement step for measuring each quiescent power supply current (QPSC) of each of a plurality of reference semiconductor integrated circuits (ICs), a plurality of times in a predetermined interval after stop of the operation of the first IC; a first data calculation step for calculating each first QPSC average of measured QPSCs of each reference IC, each first standard deviation of the measured QPSCs of each reference IC, and each of first coefficients defined by ((the measured QPSCs–the corresponding first QPSC average)/ the corresponding first standard deviation); a second measurement step for measuring a QPSC of a test IC a plurality of times in the same conditions to the reference ICs after stop of the operation of the test IC; a second data calculation step for calculating a first QPSC average of measured QPSCs of the test IC, and second deviations defined by (the measured QPSCs of the test IC–the first QPSC average); a third data calculation step for performing regression analysis on the first coefficients and the second deviations to produce a regression analysis, calculating a predicted coefficient from the regression line and a gradient of the regression line, and calculating a decision coefficient by the following formula, and $$1 - \frac{\sum (\text{the first coefficients} - \text{the predected coefficient})^2}{\sum (\text{the second deviations})^2}$$

a comparison and determination step for comparing the test IC as a defect-free IC when the decision coefficient is greater than a limit and (the gradient/the second deviations) are in a predetermined range.

According to a fifth aspect of the present invention, there is provided a method of determining a defect-free or defect semiconductor integrated circuit, comprising: a first measurement step for measuring each quiescent power supply current (QPSC) of each of a plurality of reference semiconductor integrated circuits (ICs), a plurality of times in a predetermined interval after stop of the operation of the first IC; a first data calculation step for calculating each first QPSC average of measured QPSCs of each reference IC, each first standard deviation of the measured QPSCs of each reference IC, each of first normalized values defined by ((the measured QPSCs–the corresponding first QPSC average)/ the corresponding first standard deviation), each of first average normalized value of each of first normalized values, and each of first feature value defined by ((each of the measured QPSCs–the corresponding each first QPSC average)–(the corresponding each first normalized values/ the corresponding each first standard deviation)); a second measurement step for measuring a QPSC of a test IC a plurality of times in the same conditions to the reference ICs after stop of the operation of the test IC; a second data calculation step for calculating a second QPSC average of measured QPSCs of the test IC, a second standard deviation of the measured QPSCs of the test IC, second normalized values defined by ((the measured QPSCs of the test IC–the second QPSC average)/the second standard deviation)), and second normalized value deviation defined as (the second normalized values–the average normalized values); a third data calculation step for performing regression analysis on the first coefficients and the second deviations to produce a regression analysis, calculating a predicted feature value from the regression line and a gradient of the regression line, and calculating a decision coefficient by the following formula, and $$1 - \frac{\sum (\text{the first feature values} - \text{the predected feature value})^2}{\sum (\text{the second standard values} - \text{an average of the second standard value})^2}$$

a comparison and determination step for determining the test IC as a defect-free IC when the decision coefficient is greater than a limit and the gradient is in a predetermined range.

According to the present invention, there is provided apparatuses for carrying out above methods.

BRIEF DESCRIPTION OF THE DRAWINGS

These and other objects and features of the present invention will become clearer from the following description of the preferred embodiments given with reference to the attached drawings, wherein:

FIG. 15 is a flow chart of computer processing in the tester in FIG. 9 and shows a first embodiment of a method for determining defect of a CMOS integrated circuit;

DESCRIPTION OF THE PREFERRED EMBODIMENTS

Preferred embodiments of the present invention will be described in detail below with reference to the attached figures.

First, a basic concept of the present invention will be described and preferred embodiments will be described.

One example of a semiconductor integrated circuit (IC) of the present invention is referred to a CMOS IC.

Defect-free CMOS Integrated Circuit

In a CMOS IC, circuit leakage current and deep submicron (ICs of gate length of under 0.25 $\mu$m) FET leakage current sometimes exhibit values of more than several hundred $\mu$A. These leakage currents often differ for individual CMOS integrated circuits due to the variability of manufacturing conditions even for CMOS integrated circuits of the same design and formed on the same semiconductor wafer.

Further, the circuit leakage current may change at each vector point (strobe point) due to the changes in internal nodes depending on the test pattern, and the FET leakage current may change due to a drain induced barrier lowering (DIBL) and/or a gate inducted drain leakage (GIDL). Regarding on this matter, reference may be made to M. C. Johnson, D. Somasekhar, and K. Roy, "Models and Algorithms for Bounds on Leakage in CMOS Circuits", in *IEEE Tran. CAD IC Sys.*, vol. 18, no. 6, pp. 714–725, June 1999.

In this embodiment of the present invention, when measuring the quiescent power supply circuit (QPSC) $I_{DDQ}$ in the CMOS IC, as the quiescent state, a clock applied to the CMOS IC is held from the time of end of switching of the test pattern, the current value after a predetermined time passes and the current stabilizes is measured several times at a predetermined interval. It is assumed that the measured current may include current other than the FET leakage current.

The reason why the measurement of the several times of the QPSC is preferable, is that the QPSC may vary in the elapse of the time even in the quiescent state of the CMOS IC.

In the specification, the measurement points are called as vector points.

When assigning serial numbers to the vector points (measurement points) and preparing a plotted graph of the distribution of plotted points showing vector points and measured current values at those vector points, the vector waveforms comprised of lines connecting the plotted points in the order of their serial numbers can be considered to often resemble or approximately resemble each other between defect-free CMOS integrated circuits.

Figure 1:
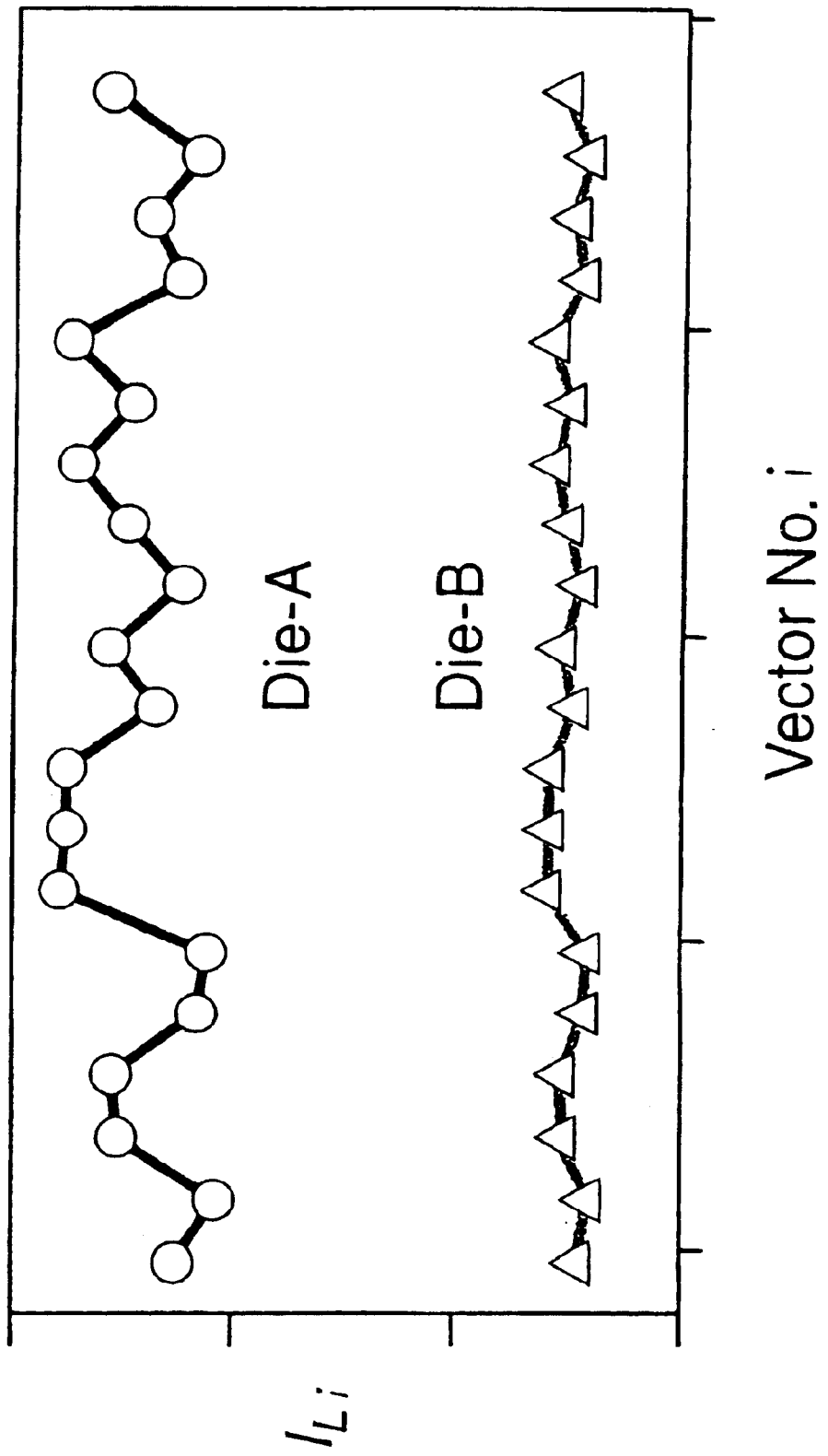
FIG. 1 is a first explanatory view illustrating the case where vector waveform resemble each other between defect-free CMOS integrated circuits.
Figure 2:
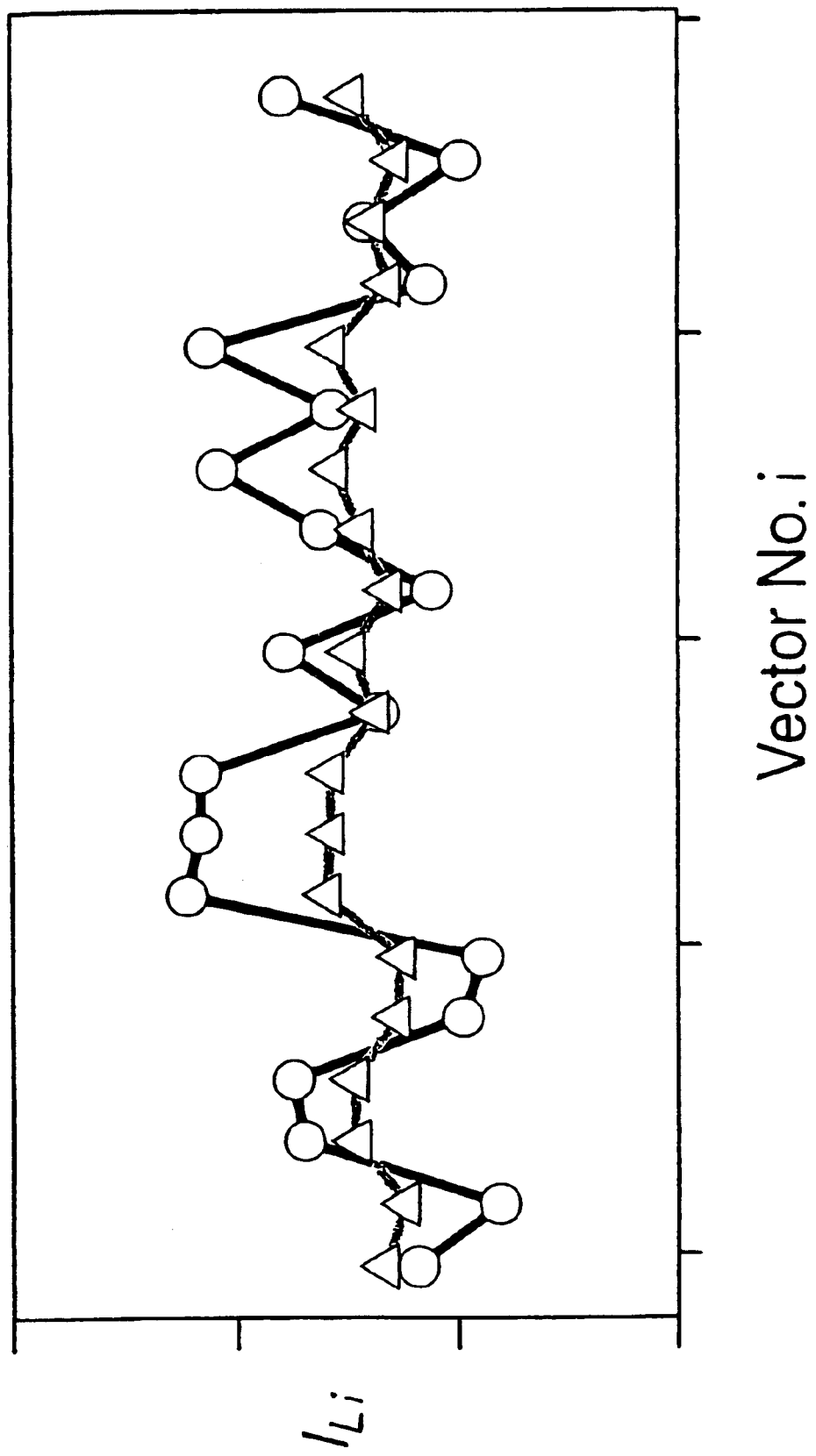
FIG. 2 is a second explanatory view illustrating the case where vector waveforms resemble each other between defect-free CMOS integrated circuits.
Figure 3:
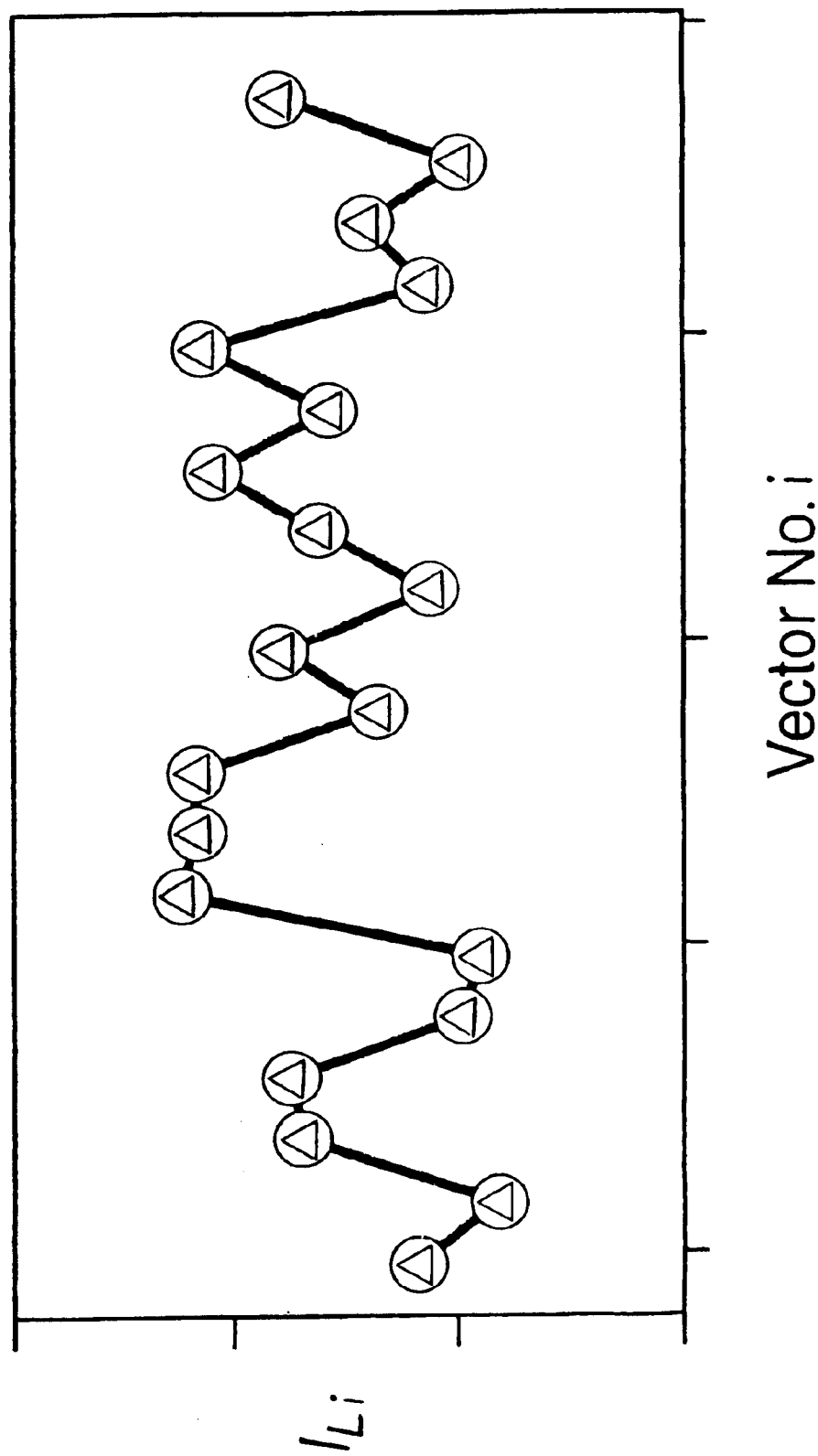
FIG. 3 is a third explanatory view illustrating the case where vector waveforms resemble each other between defect-free CMOS integrated circuits.

FIG. 1 to FIG. 3 are explanatory views illustrating cases of vector waveforms resembling each other between defect-free CMOS integrated circuits. Note that in FIG. 1 to FIG. 3, the abscissa indicates the serial numbers i of the vector points, the ordinate shows the current values $I_{Li}$ of the quiescent power supply current, and there are a total of 20 vector points in each CMOS integrated circuit.

FIG. 1 is a view illustrating the relationship between vector points showing measurement points for measuring the quiescent power supply current and the measured value of the quiescent power supply current at the vector points in two defect-free CMOS integrated circuits Die-A and Die-B. This drawing shows vector waveforms comprised of bent lines connecting the plotted points.

Note that the O marks (circles) correspond to the measured value of the quiescent power supply current at the vector points in the defect-free CMOS integrated circuit Die-A, while the Δ marks (triangles) correspond to the measured value of the quiescent power supply current at the vector points of the defect-free CMOS integrated circuit Die-B.

FIG. 2 is a view of the case when the vector waveforms of FIG. 1 are shifted to be superposed.

FIG. 3 is a view of the case when the vector waveform of the Die-B in FIG. 1 is enlarged in the vertical direction and the enlarged vector waveform and the vector waveform of the Die-A are superposed. The vector waveforms overlap and coincide. In this way, the vector waveforms of the defect-free CMOS integrated circuits Die-A and Die-B shown in FIG. 1 to FIG. 3 resemble each other. Further, it is possible to sort out the defect-free CMOS integrated circuits using this resemblance.

In the present invention, by using the resemblance of two semiconductor ICs, more specifically, by using the resemblance of two feature data (or feature parameters) such as the vector waveforms obtained from the measured quiescent power supply currents (QPSCs) of two semiconductor ICs, a defect-free IC can be determined. If the both feature data are resemble, the both IC are defect-free. If the defect-free IC is found, other ICs can be tested by using the found defect-free IC as a reference IC.

A variety of the determination methods by using the resemblance of the present: invention will be described below.

Considering the resemblance of the vector waveforms of defect-free CMOS integrated circuits, a quiescent power supply current $I_{DDQ}$ of a defect-free CMOS integrated circuit, that is, a normal leakage current $I_{Li}$, is expressed by the following equation (1). Note that in equation (1), $R_i$ is a proportional coefficient, and i is the index of the vector point.

$$I_{Li}=R_i \cdot Ip+I_{AL} \tag{1}$$

In equation (1), the relationship of the following equation (2) stands between a current parameter Ip and a constant current in the whole vector points $I_{AL}$ and the mean (average) value $I_l$ of the normal leakage currents $I_{Li}$.

$$I_l=Ip+I_{AL} \tag{2}$$

Measured Current and Defect Current

In a CMOS integrated circuit existing a defect current, a measured value $I_{Qi}$ of the quiescent power supply current measured at each vector point is expressed by the following equation (3), namely, the total of the normal leakage current $I_{Li}$, the defect current $I_{RDi}$ occurring independently or randomly at each vector point, and the constant defect current $I_{SD}$ occurring similarly at each vector point.

$$I_{Qi}=I_{Li}+I_{RDi}+I_{SD} \tag{3}$$

Defect-Free Device Selection

To determine defect or indefectibly (defect-free) CMOS integrated circuits, it is desirable to collect defect-free CMOS integrated circuits in advance. This collecting of defect-free CMOS integrated circuits is called as "defect-free device selection".

Normally, many CMOS ICs are formed in a same semiconductor wafer. A plurality of defect-free CMOS ICs used for reference ICs are selected among many CMOS ICs, and other CMOS ICs are tested by using such reference ICs.

Of course, it is not always required such the many reference ICs, and it is enough by selecting at least one reference (defect-free) IC.

Note, the defect-free device sorting can be applied to the defect-free or defect IC detection.

Defect-Free Device Selection—1

A deviation $I_{DLi}$ is expressed by the following equation (4) by using the normal leakage current $I_{Li}$ at each vector point i (i=1 to n) in a defect-free CMOS integrated circuit and the mean value $I_l$ of the currents. Note that when the total number n of the vector points is made a plurality of points, the mean value $I_l = (I_{L1}+I_{L2}+\ldots+I_{Ln})/n$.

$$I_{DL1}=I_{Li}-I_l \tag{4}$$

By substituting the normal leakage current $I_{L1}$ Of the above equation (1) and the mean value $I_l$ of the above equation (2) into the above equation (4), the following equation (5) is obtained.

$$I_{DL1}=(R_i \cdot Ip+I_{AL})-(Ip+I_{AL})$$
$$=(R_i-1) \cdot Ip \tag{5}$$

The ratio of deviations at vector points for two defect-free CMOS integrated circuits X and Y is shown by the following equation (6).

$$I_{DLyi}/I_{DLxi}=\{(R_i-1) \cdot Ipy\}/\{(R_i-1) \cdot Ipx\}$$
$$=Ipy/Ipx \tag{6}$$

The parameters Ip and deviations $I_{DL1}$ of the two defect-free CMOS integrated circuits are made the parameter Ipx and the deviation $I_{DLxi}$ for the CMOS integrated circuit X and made the parameter Ipy and deviation $I_{DLyi}$ for the CMOS integrated circuit Y.

In this way, when the CMOS integrated circuits X and Y are defect-free, the ratio of the deviations ($I_{DLyi}/I_{DLxi}$) of the normal leakage flows is constant regardless of the vector points. The ratio of deviations ($I_{DLYi}/I_{DLxi}$) is made equal to $S_A$, $S_A=I_{DLYi}/I_{DLxi}$.

Figure 4:
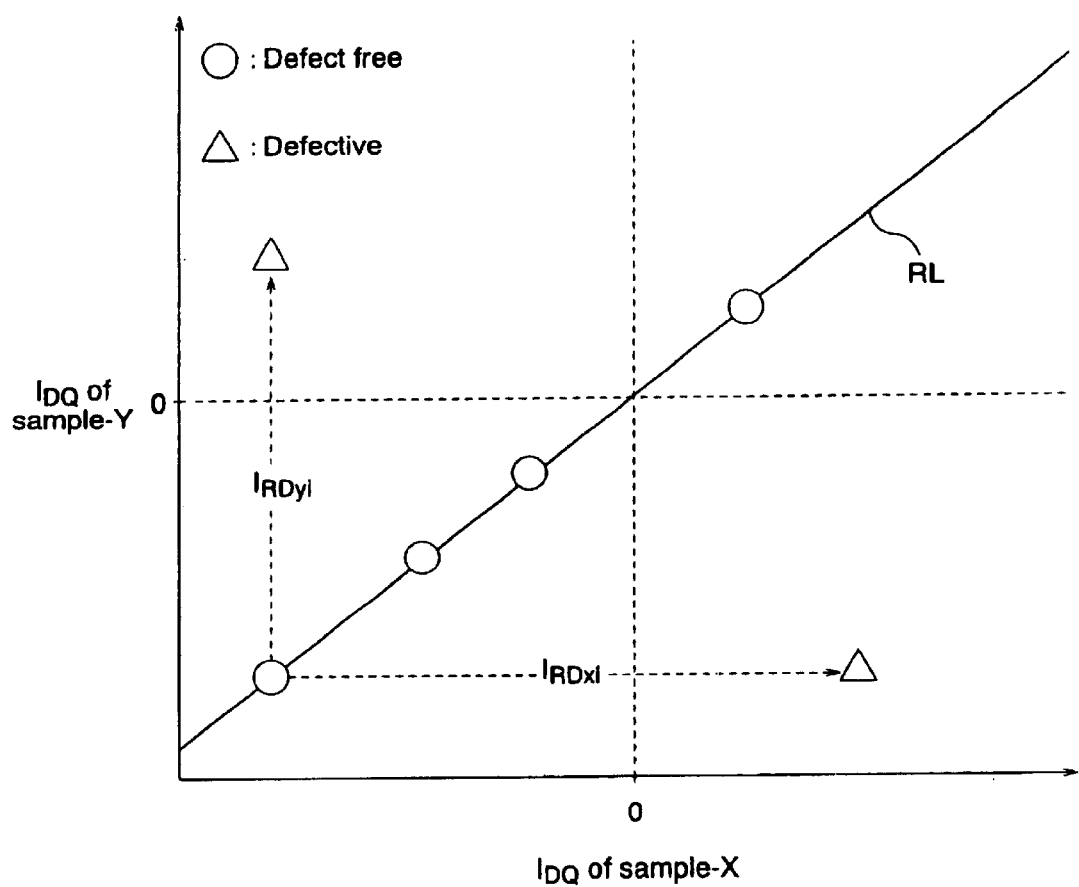
FIG. 4 is a plot graph view of an example of the distribution of plotted points showing deviations at different vector points for two CMOS in tegrated circuits sampled from a plurality of CMOS integrated circuits under test.

FIG. 4 is an explanatory view plotting the deviations at each vector point for two CMOS integrated circuits X and Y extracted from a plurality of CMOS integrated circuits under test. The defect-free device is shown by the O marks (circles), while the defective device is shown by the Δ marks (triangles).

Namely, when the both CMOS IC X and Y are defect-free, the normal leakage current deviations $I_{DLxi}$ and $I_{DLyi}$ are plotted in an orthogonal coordinates to obtain a substantially strait line:RL having a gradient (slant) $S_A$. The line RL is called as a regression (recursive) line.

The gradient $S_A$ can be obtained by, for example, a root mean square method.

When the two sampled CMOS integrated circuits X and Y are defect-free, the plotted points of the normal leakage current deviations $I_{DLxi}$ and $I_{DLyi}$ form a line (regression line). The slant of this line is $S_A$.

Predicted values $Y_{Hi}$ of the quiescent power supply current of the CMOS IC will be calculated by using the regression line and the slant $S_A$, as described below.

A decision coefficient (correlation coefficient, residual square) $r^2$ showing the correlation between two CMOS integrated circuits is expressed by the following equation (7). When the two CMOS integrated circuits are defect-free, the value of $r^2$ is 1 or substantially 1.

$$r^2 = 1 - \frac{\sum_{i=1}^{n}(y_i - y_{Hi})^2}{\sum_{i+1}^{n}(y_i - y_A)^2} \quad (7)$$

Note that in the above equation (7), $y_i$ indicates the measured values of the quiescent power supply current of the CMOS integrated circuit Y at a vector point i, $y_A$ is the mean (average) value of the measured value $y_i$ (=$I_{Qyi}$), and $Y_{Hi}$ is the predicted values obtained by predicting the measured values $y_i$ using the regression line from the measured value $x_i$ (=$I_{Qxi}$) of the quiescent power supply current (QPSC) of the CMOS integrated circuit X at the vector point i. The actual measured value $y_i$ of the QPSC of the CMOS IC Y is called as an actual value.

Specifically, when the measured value $y_i$ of the quiescent power supply current of the CMOS integrated circuit Y can be approximated by $$Y_i \approx C + S_A X_i, \quad (7\text{-}1)$$

the predicted value $Y_{Hi}$ is expressed by the regression equation $$Y_{Hi} = C + S_A \cdot x_i \quad (7\text{-}2)$$

The term c in the regression equation indicates a constant.

The smaller the difference between the measured value $y_i$ and the predicted value $y_{Hi}$, the smaller the deviation from the predicted value shown. Therefore, it is possible to use the above equation (7) to calculate the decision coefficient $r^2$ and use this decision coefficient $r^2$ as a yardstick for applicability (matching) of the regression equation.

Note that for regression analysis, reference may be made to Takemura, Kyoritsu Seminar on Mathematics in the 21st Centuzy-14: Statistics, pp. 36–37, Kyoritsu Publishing, 1997.

When one or both of the measured values of the quiescent power supply current of two CMOS integrated circuits includes a defect; current $I_{RDi}$, the plot or plotted points of the measured value(s) is or are deviated from the regression line and the value of the decision coefficient $r^2$ becomes smaller.

In a defect-free CMOS integrated circuit, if $I_{AL} = 0$ in the above equations (1) and (2), when one or both of the two CMOS integrated circuits includes a certain defect current $I_{SD}$, the mean value Iq of the measured value $I_{Qi}$ becomes larger than the mean value $I_l$ of the normal leakage currents $I_{Li}$ and the ratio (Iqy/Iqx) of the mean values Iqy and Iqx of the quiescent power supply current of the two CMOS integrated circuits Y and X no longer coincides with the slant $S_A$ of the regression line.

Then, in the two CMOS integrated circuits X and Y, when the condition that the decision coefficient $r^2$ is larger than the preset lower limit $L_{RA}^2$ and the condition that the difference ($S_A$–Iqr/Iqx) between the ratio of the mean values of the quiescent power supply current and the slant $S_A$ of the regression line is within a preset range, it is possible to determine that the two CMOS integrated circuits X and Y resemble each other in vector waveforms and sort out the circuits as defect-free circuit.

Defect-Free Device Selection—2

A standard deviation $\sigma_L$ of the normal leakage current $I_{Li}$ of the above equation (1) is expressed by the following equation (8) using the standard deviation $\sigma_R$ of a proportional coefficient $R_i$.

$$\sigma_L = \sigma_R Ip \quad (8)$$

A normalized value $R_{Li}$ of the normal leakage current $I_{Li}$ is expressed by the following equation (9) using the mean value $I_l$ and the standard deviation $\sigma_L$.

$$R_{Li} = (I_{Li} - I_l)/\sigma_L \quad (9)$$

The above equation (9) can be modified as in the following equation (10) using equations (4) and (5).

$$R_{Li} = I_{DL1}/\sigma_L$$

$$= (R_i - 1) \cdot Io/\sigma_L \quad (10)$$

The above equation (10) can be modified as in the following equation (11) using equation (8).

$$R_{Li} = (R_i - 1) \cdot Ip/(\sigma_R \cdot Ip)$$

$$= (R_i - 1)/\sigma_R \quad (11)$$

From the above equation (11), the normalized value $R_{Li}$ becomes the same value regardless of the magnitude of the normal leakage current $I_{Li}$. Therefore, when the two CMOS integrated circuits X and Y are defect-free, if finding the ratio of the normalized values at the vector points, the value becomes 1 as shown in the following equation (12). Note that in the following equation (12), the normalized value of the normal leakage current of the CMOS integrated circuit X is named as $R_{Lxi}$ and the normalized value of the normal leakage current of the CMOS integrated circuit Y is named as $R_{Lyi}$.

$$R_{Lyi}/R_{Lxi} = \{(R_i - 1)/\sigma_R\}/\{(R_i - 1)/\sigma_R\}$$

$$= 1 \quad (12)$$

On the other hand, the normalized value $R_{Qi}$ of a measured value $I_{Qi}$ of the quiescent power supply current including a defect current is expressed by the following equation (13) using the standard deviation $\sigma_Q$ and mean value Iq of the measured value $I_{Qi}$.

$$R_{Qi} = (I_{Qi} - I_l)/\sigma_Q \quad (13)$$

By using equation (3) for the above equation (13), the following equation (14) is obtained. Note that the mean value of the defect currents $I_{RDi}$ is expressed by $I_{rd}$.

$$R_{Qi} = \{(I_{Li} + I_{RDi} + I_{SD}) - (I_l I_{rd} + I_{SD})\}/\sigma_Q = (I_{Li} - I_{RDi} - I_{rd})/\sigma_Q \quad (14)$$

Since the change in the standard deviation $\sigma_Q$ due to the defect current $I_{RDi}$ is small, the standard deviation $\sigma_Q$ can be approximated by the standard deviation $\sigma_L$ of the normalized value $R_{Li}$ of the normal leakage current $I_{Li}$. The above equation (14) can be modified to the following equation (15) by this approximation.

$$R_{Qi}=(I_{Li}-I_l)/\sigma_L+(I_{RDi}-I_{rd})/\sigma_L$$

$$=R_{Li}+(I_{RDi}-I_{rd})/\sigma_L \quad (15)$$

The mean values Iqx and Iqy and standard deviations $\sigma_{Qx}$ and $\sigma_{Qy}$ are calculated and the normalized values $R_{Qxi}$ and $R_{Qyi}$ are calculated from the measured values $I_{Qxi}$ and $I_{Qyi}$ of the quiescent power supply current of the two CMOS integrated circuits X and Y. Further, regression analysis is performed on the normalized values ($R_{Qxi}$ and $R_{Qyi}$) to obtain the regression line.

The gradient $S_B$ of the regression line by, for example a root means square method, and predicted normalized value $R_{Hi}$ are obtained by using the gradient $S_B$ and the regression line, as shown in the formula (7-2). Thereafter, a decision coefficient $r_B^2$ is calculated by the following formula.

$$r_B^2 = 1 - \frac{\sum(R_{Qyi}-R_{Hi})^2}{\sum(R_{Qyi}-R_A)^2} \quad (7A)$$

where, $R_A$ is an average of $R_{qyi}$.

In the plotted graph of the normalized value $R_{Qi}$, due to the deviation of the normalized value $R_{Qi}$ from the regression line by the defect current $I_{RDi}$, the decision coefficient $r_B^2$ becomes smaller, so it is possible to select defect-free devices by setting a lower limit of the decision coefficient $r_B^2$.

When the condition that the decision coefficient $r_B^2$ is larger than a preset lower limit $L_{RB}^2$ and the condition that the difference ($S_B-1$) between the slant $S_B$ of the regression line and 1 is within a preset allowable range are satisfied, it can be determined that the two CMOS integrated circuits X and Y resemble each other in vector waveform and the devices can be sorted out as defect-free.

Defect-free Device Selection—3

By using equation (2), it is possible to modify equation (8) to the following equation (16).

$$\sigma_L=\sigma_R\cdot(I_l-I_{AL}) \quad (16)$$

By modifying the above equation (16), the following equation (17) is obtained.

$$I_l=I_{AL}+\sigma_L/\sigma_R \quad (17)$$

When preparing a plotted graph using the standard deviation $\sigma_Q$ of the measured value $I_{Qi}$ of the quiescent power supply current for CMOS integrated circuits under test as the abscissa and using the mean value Iq as the ordinate, the plotted points corresponding to defect-free CMOS integrated circuits are positioned on a straight line (ideal line).

Therefore, it is possible to sort out CMOS integrated circuits corresponding to the plotted points positioned in an allowable range from the ideal line (for example, an intermediate region between upper and lower parallel lines to the ideal line) among the CMOS integrated circuits under test as being defect-free circuits.

Figure 5:
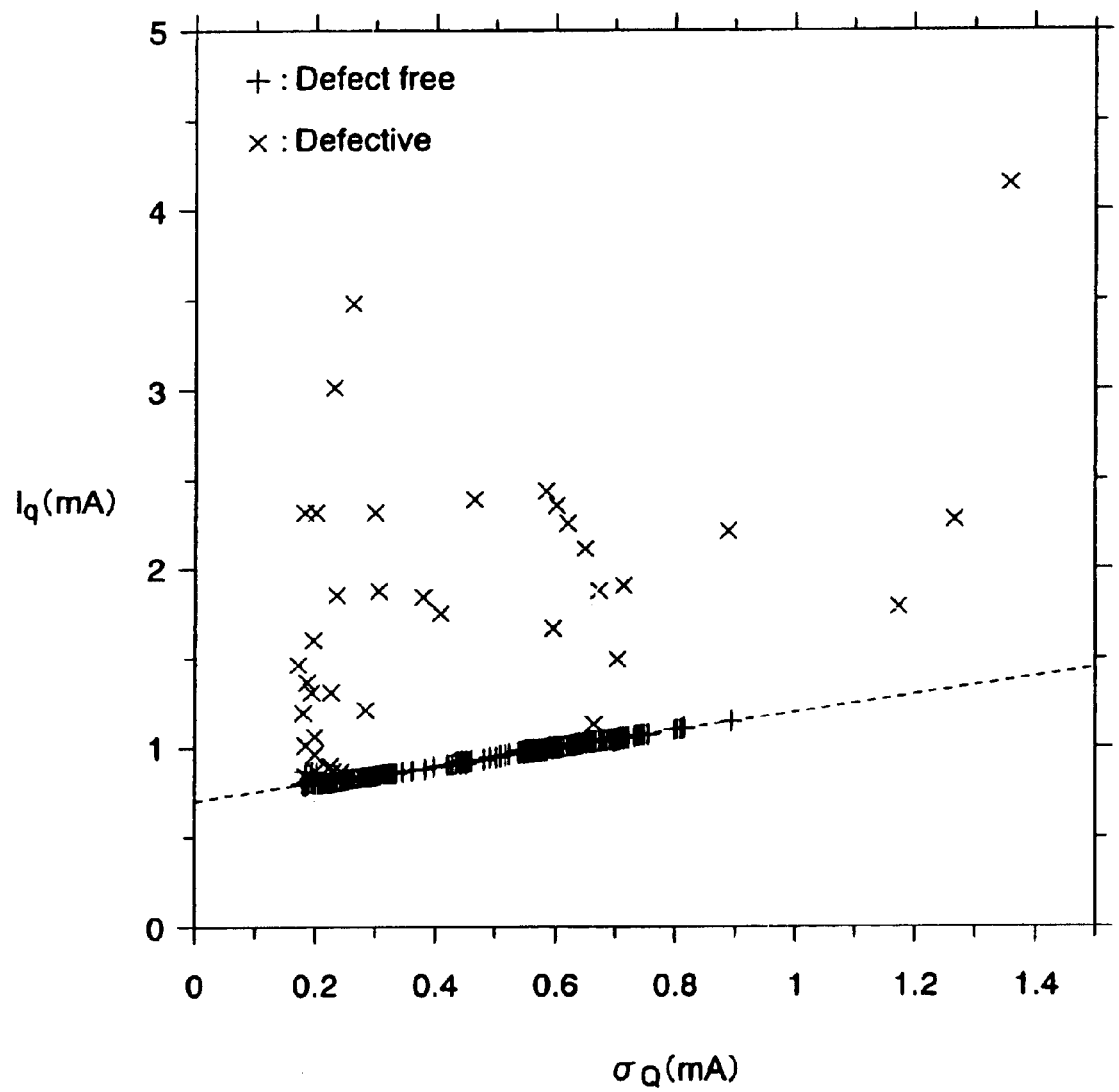
FIG. 5 is a plotted graph of an example of the distribution of plotted points showing a mean value of a plurality of measured values of a quiescent power supply current a nd a standard deviation for approximately 800 CMOS integrated circuits passing a scan test.

FIG. 5 is a plotted graph illustrating the distribution between the mean value Iq and standard deviation $\sigma_Q$ of the measured value of the quiescent power supply current and the standard deviation $\sigma_Q$ for approximately 800 CMOS integrated circuits passing a scan test. Most of the plotted points corresponding to the defect-free CMOS integrated circuits are positioned on or near the line of Iq=0.7+0.5·$\sigma_Q$ (that is, the ideal line).

Note that the plotted points of the x marks correspond to the defective CMOS integrated circuits not passing a functional test. The plotted points of the +marks correspond to the defect-free CMOS integrated circuits passing the functional test.

Figure 6:
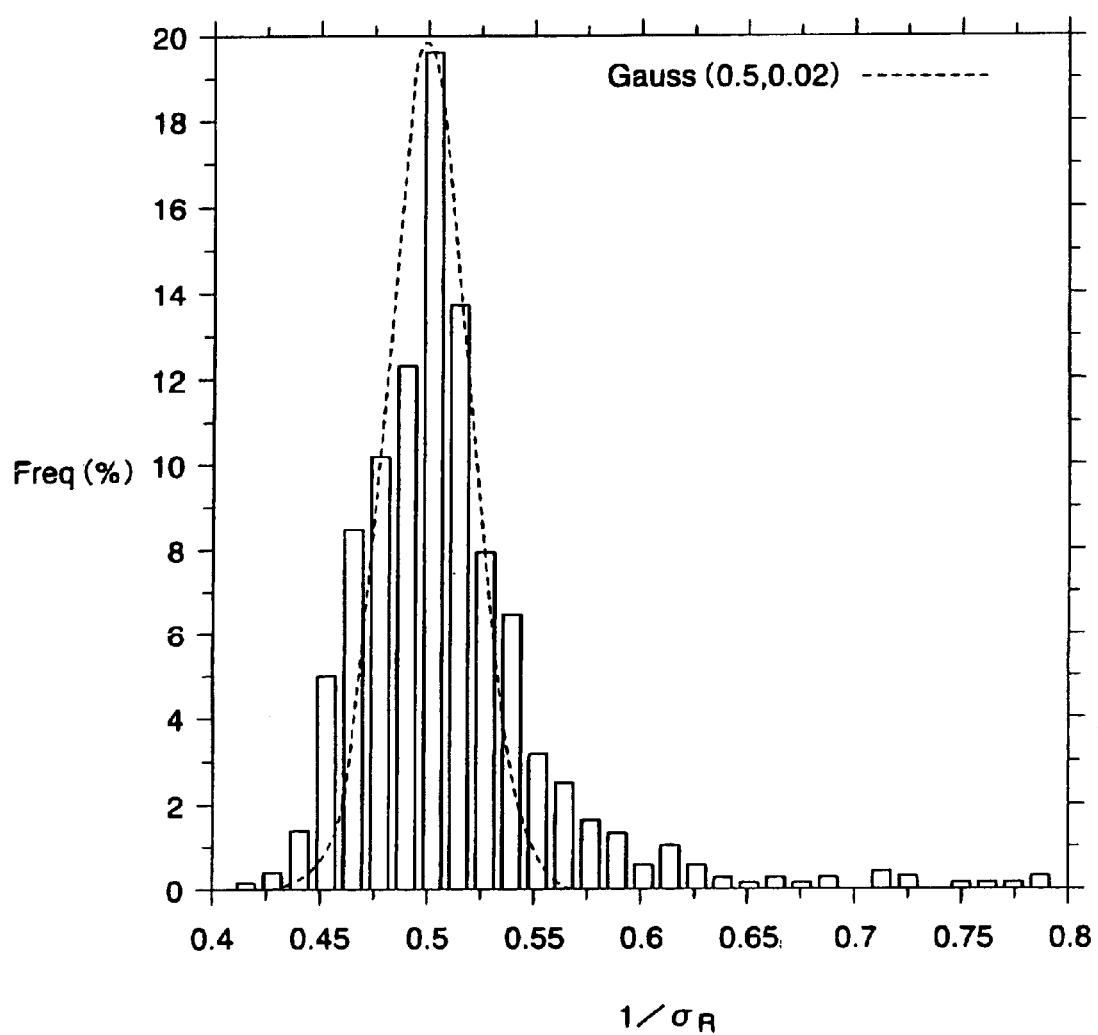
FIG. 6 is a graph illustrating the distribution of reciprocals ($1/\sigma_R$) of standard deviations of proportional coefficients $R_i$ for the group of a plurality of CMOS integrated circuits of FIG. 5.

FIG. 6 is a graph of the reciprocals ($1/\sigma_R$) of the standard deviations of the proportional coefficients $R_i$ for the group of CMOS integrated circuits of FIG. 5. In this graph, the abscissa shows $1/\sigma_R$, while the ordinate shows the frequency. The mean value of the distribution is about 0.5, the standard deviation of the distribution is about 0.02, and the mean value of the distribution coincides with the slant 0.5 of the ideal line in FIG. 5.

Defect-free Device Selection-4

The equation (5) showing the deviation $I_{DL1}$ of the normal leakage current $I_{Li}$ can be modified to the following equation (18) using equation (2).

$$I_{DL1}=(R_i-1)\cdot(I_l-I_{AL})$$

$$=(R_i-1)\cdot I_l+(1-R_i)\cdot I_{AL} \quad (18)$$

Here, if preparing a plotted graph of the distribution of plotted points showing the deviation $I_{DL1}$ and mean value $I_l$ for defect-free CMOS integrated circuits, the plotted points are positioned on or near the line corresponding to the above equation (18).

The deviation $I_{DQi}$ of at measured value $I_{Qi}$ of the quiescent power supply current including a defect current $I_{RDi}$ is expressed by the following equation (19) using equations (3) and (18).

$$I_{DQi}=I_{Qi}-Iq$$

$$=(I_{Li}+I_{RDi}+I_{SD})-(I_l+I_{rd}+I_{SD})$$

$$=I_{DL1}+I_{RDi}-I_{rd}$$

$$=(R_i-1)\cdot I_l+(1-R_i)xI_{AL}+I_{RDi}-I_{rd} \quad (19)$$

By substituting $I_l=I_t-I_{rd}-I_{SD}$ in the above equation (19), the following equation (20) is obtained.

$$I_{DQi}=(R_i-1)\cdot(Iq-I_{rd}-I_{SD})+(1-R_i)\cdot I_{AL}-I_{rd}+I_{RDi}$$

$$=(R_i-1)\cdot Iq+(1-R_i)\cdot(I_{AL}+I_{SD})-R_i\cdot I_{rd}+I_{RDi} \quad (20)$$

If preparing a plotted graph of the distribution of the plotted points showing the deviation $I_{DQi}$ and mean value Iq for CMOS integrated circuits under test from the difference between the above equation (20) and equation (18), when a measured current $I_{Qi}$ includes a defect current, its plot is positioned deviated from the line corresponding to the above equation (18) (ideal line).

Therefore, it is possible to sort out the CMOS integrated circuits corresponding to plotted points positioned in an allowable range from the ideal line (for example, the intermediate region sandwiched between upper and lower parallel lines of the ideal line) among the CMOS integrated circuits under test as being defect-free. This selection method is effective when the number of vectors is small.

Figure 7:
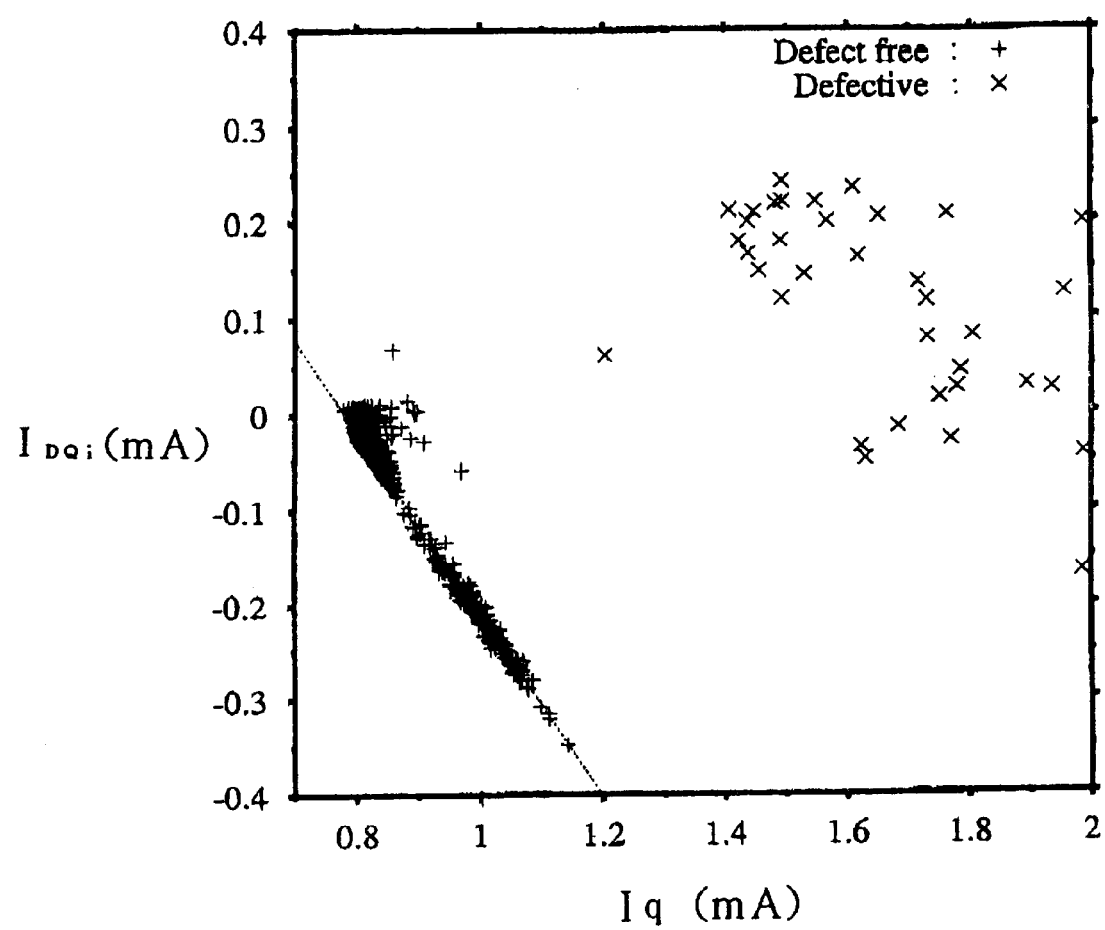
FIG. 7 is a plotted graph of an example of distribution of plotted points showing a mean value of a measured value of quiescent power supply current and deviation for approximately 800 CMOS integrated circuits.

FIG. 7 is a plotted graph illustrating the distribution of the mean value Iq and deviation $I_{DQi}=I_{Qi}-Iq(N=1)$ of the quiescent power supply current for about 800 CMOS integrated circuits. Most of the plotted points corresponding to the defect-free CMOS integrated circuits are positioned on or near the line of $I_{DQi}$=0.75–0.96·Iq (that is, the ideal line).

Note that the plotted points of the x marks correspond to the defective CMOS integrated circuits not passing a functional test. The plotted points of the +marks correspond to the defect-free CMOS integrated circuits passing the functional test.

Predicted Error

The normalized value $R_{Li}$ is calculated for each of the plurality of defect-free CMOS integrated circuits obtained by the selection of defect-free circuits. The normalized values $R_{Li}$ are averaged for the plurality of CMOS integrated circuits to calculate the reference normalized value $R_{Ni}$. By using this normalized value $R_{Ni}$ and equation (9), the predicted value $J_{Li}$ of a normal leakage current $I_{Li}$ can be obtained by the following equation (21).

$$J_{Li} = R_{Ni} \cdot \sigma_L + I_l \tag{21}$$

The predicted error $E_i$ is expressed by the following equation (22) using the measured value $I_{Li}$, mean value $I_l$, and standard deviation $\sigma_L$ of quiescent power supply current of a defect-free CMOS integrated circuit on which the calculation of the standard deviation $R_{Ni}$ was based.

$$E_i = I_{Li} - J_{Li}$$
$$= I_{Li} - I_l - R_{Ni} \cdot \sigma_L \tag{22}$$

Figure 8:
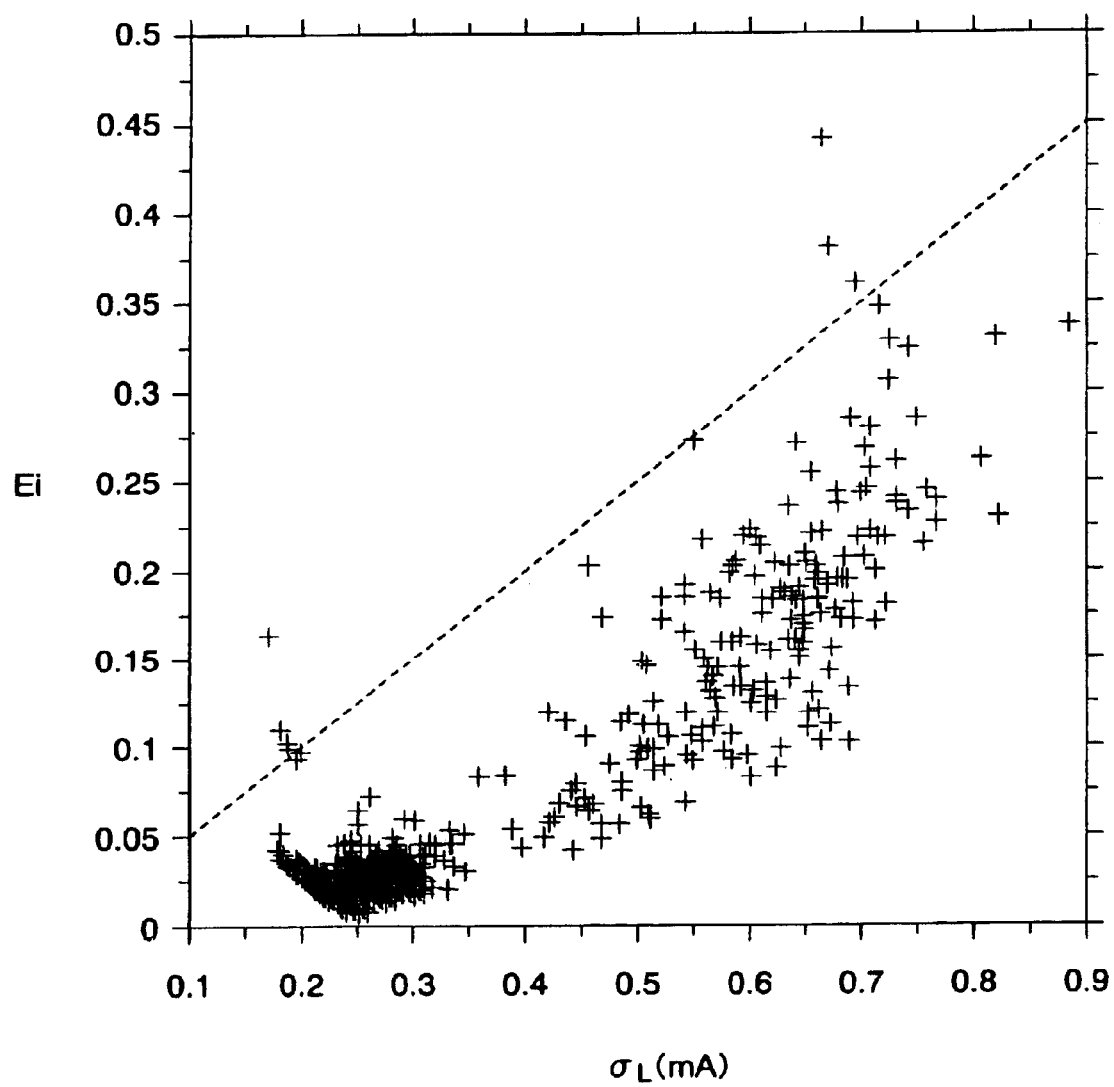
FIG. 8 is a plotted graph illustrating the distribution of plotted points showing a standard deviation and predicted error for defect-free CMOS integrated circuits.

FIG. 8 is a plotted graph illustrating the distribution of plotted points showing a standard deviation $\sigma_L$ and predicted error $E_i$ for defect-free CMOS integrated circuits. In FIG. 8, the predicted error $E_i$ is less than about half of the standard error $\sigma_L$, that is, the maximum value $E_{MAX}$ is about half of the standard deviation $\sigma_L$.

It is possible to find the maximum value $E_{MAX}$ of the predicted error $E_i$ for all vector points of defect-free CMOS integrated circuits in this way.

Determination of Defect or Defect-free

Defect or defect-free CMOS integrated circuit under test can be determined based on the features of a defect-free CMOS integrated circuit obtained by selection out defect-free circuits and the measured value $I_{Qi}$ of quiescent power supply current of the CMOS integrated circuit under test.

Determination of Defect or Defect-free—1 ($I_{RD}$ Test)

Consider an estimated error $P_{Di}$ of the following equation (23) for a CMOS integrated circuit under test based on equation (22). In this equation (23), the measured value $I_{Qi}$, mean value Iq, and standard deviation $\sigma_Q$ of quiescent power supply current of the CMOS integrated circuit under test are used.

$$P_{Di} = I_{Qi} - Iq - R_{Ni} \cdot \sigma_Q \tag{23}$$

The mean value Iq of the measured value $I_{Qi}$ is expressed by the following equation (24) using equation (3).

$$Iq = I_l + I_{rd} + I_{SD} \tag{24}$$

By applying equations (24), (3), and (22) to equation (23), it is possible to obtain the following equation (25).

$$P_{Di}(I_{Li} + I_{RDi} + I_{SD}) - (I_l + I_{rd} + I_{SD}) - R_{Ni} \cdot \sigma_Q$$
$$\approx I_{Li} - I_l - R_{Ni} \cdot \sigma_L + I_{RDi} - I_{rd}$$
$$= E_i + I_{RDi} - I_{rd} \tag{25}$$

In the above equation (25), the standard deviation $\sigma_Q$ closes the standard deviation $\sigma_L$ since the change due to the defect current $I_{RDi}$ is small.

In a defect-free circuit, the defect current $I_{RDi}$ is 0 or substantially 0, so the condition for determination of defect or defect-free can be expressed by the following equation (26).

$$-E_{MAX} < P_{Di} < E_{MAX} \tag{26}$$

The defect current $I_{RDi}$ of a defective circuit is expressed by the following equation (27) using the above equation (25) when the predicted error $E_i = E_{MAX}$. The value expressed by this equation (27) can be used as a yardstick.

$$I_{RDi} = P_{Di} - E_{MAX} + I_{rd} \tag{27}$$

Determination of Defect or Defect-free—2 ($I_{SD}$ Test)

When there is no defect current $I_{RDi}$ in the measured value $I_{Qi}$ of quiescent power supply current of a CMOS integrated circuit, the measured value $I_{Qi}$ is expressed by the following equation (28) from equation (3).

$$I_{Qi} = I_{Li} + I_{SD} \tag{28}$$

The standard deviation $\sigma_Q$ of a measured value $I_{Qi}$ in this case is equal to the standard deviation $\sigma_L$ of the normal leakage current $I_{Li}$, so the parameter Ip is expressed by the following equation (29) from equation (8).

$$Ip = \sigma_Q / \sigma_R \tag{29}$$

The mean value Iq of the measured value $I_{Qi}$ of the above equation (28) is expressed by the following equation (30) using equation (2).

$$Iq = I_l + I_{SD}$$
$$= Ip + I_{AL} + I_{SD} \tag{30}$$

From the above equations (30) and (29), the total ($I_{AL} + I_{SD}$) of the DC components of the measured value $I_{Qi}$ is expressed by the following equation (31).

$$I_{AL} + I_{SD} = Iq - Ip$$
$$= Iq - \sigma_Q / \sigma_R \tag{31}$$

When the leakage current of a CMOS integrated circuit under test is only the FET leakage current, as shown by the following equation (32), the condition for a defect-free circuit may be made that the total ($I_{AL} + I_{SD}$) be less than the maximum value $E_{MAX}$ of the predicted error $E_i$.

$$E_{MAX} > Iq - \sigma_Q / \sigma_R \tag{32}$$

When the leakage current of a CMOS integrated circuit under test includes a circuit leakage current and there is variability in the magnitude of the circuit leakage current due to variability in the manufacturing conditions, the condition of a defect-free circuit may be made that the variability be within the allowable range of variability of the magnitude of the circuit leakage current.

Note, the ratio $\sigma_Q / \sigma_R$, where $\sigma_Q$ is the standard deviation of the measured quiescent power supply current (QPSC) $I_{Qi}$ of the test CMOS IC and $\sigma_R$ is defined as $I_p = \sigma_Q / \sigma_R$ by the formula 29, is expressed as $I_p$ and thus the formula (32) is expressed as follows.

$$E_{MAX} > Iq - Ip \tag{32a}$$

($I_q - I_p$) is a deviation, namely, the variation.

In the following equation (33), the upper limit $L_{SE}$ corresponds to the allowable range.

$$L_{SE} > Iq - \sigma_Q / \sigma_R \tag{33}$$

Determination of Defect or Defect-free—3

A coefficient $K_{Li} = (I_{Li} - I_l) I_l$ corresponding to the deviation of the normal leakage current $I_{Li}$ at each vector point is calculated in advance for a plurality of defect-free CMOS integrated circuits. The coefficients $K_{Li}$ are averaged for the plurality of CMOS integrated circuits to calculate an average coefficient $K_{Ni}$.

The coefficient $K_{Li}$ (=$(L_{Li}-I_1)/I_1$) is a normalized value of the normal leakage current deviation $I_{PLi}$ by the average current $I_1$ of normal leakage current $I_{Li}$.

The calculation of the average coefficient $K_{Ni}$ from the plurality of the coefficients $K_{Li}$ is intended to increase an accuracy of the coefficient $K_{Ni}$. Therefore, the coefficient $K_{Li}$ of one reference CMOS IC can be applied in the following descriptions and equations.

Next, the mean value Iq and deviation $I_{DQi}$ (=$I_{Qi}$−Iq) are calculated from the measured value $I_{Qi}$ of a CMOS integrated circuit under test.

The regression analysis is performed on the coefficient $K_{Ni}$ and the deviation $I_{pQi}$ of the measured quiescent power supply current $I_{Qi}$, to obtain a regression line. A gradient $S_C$ of the regression line is obtained by, for example, a root mean square, and a predicted coefficient $K_{Hi}$ is calculated by using the gradient $S_C$ and the regression line expressed by the formula (7-2).

A decision coefficient $r_C^2$ is calculated by the following formula.

$$r_C^2 = 1 - \frac{\sum (K_{Ni} - K_{Hi})^2}{\sum (I_{PQi})^2} \tag{7B}$$

When the condition that the decision coefficient $r_C^2$ is greater than a preset lower limit $L_{RC}^2$ and the condition that the difference ($S_C$/Iq−1) of the ratio $S_C$/Iq and 1 is in a preset allowable range are satisfied, it is determined that the two CMOS integrated circuits resemble each other in vector waveform and the CMOS integrated circuit under test can be sorted out as defect-free.

Determination of Defect or Defect-free—4

A normalized value $R_{Li}$=$(I_{Li}-I_l)/\sigma_L$ is calculated in advance for a plurality of defect-free CMOS integrated circuits based on the normal leakage current $I_{Li}$ at each vector point and its mean value $I_l$ and standard deviation $\sigma_L$. The normalized values $R_{Li}$ are averaged for the plurality of CMOS integrated circuits to calculate an average normalized value $R_{Ni}$.

The coefficient $R_{Li}$ (=$(L_{Li}-I_1)/\sigma_1$) is a normalized value of the normal leakage current deviation $I_{PLi}$ by the standard deviation $\sigma_1$ of normal leakage current $I_{Li}$.

The calculation of the average coefficient $R_{Ni}$ from the plurality of the coefficients $R_{Li}$ is intended to increase an accuracy of the coefficient $R_{Ni}$. Therefore, the coefficient $R_{Li}$ of one reference CMOS IC can be applied in the following descriptions and equations.

Next, the mean value Iq and deviation $I_{DQi}$ (=$I_{Qi}$−Iq) and the standard deviation $\sigma_Q$ and standard deviation $R_{Qi}$=$I_{DQi}$/$\sigma_Q$ are calculated from the measured value $I_{Qi}$ of the CMOS integrated circuit under test.

The regression analysis is performed on the coefficient $R_{Ni}$ and $R_{Qi}$ to obtain a regression line. A gradient $S_D$ of the regression line is obtained by, for example, a root mean square, and a predicted coefficient $R_{Hi}$ is calculated by using the gradient $S_D$ and the regression line expressed by the formula (7-2).

A decision coefficient $r_D^2$ is calculated by the formula (7A).

When the condition that the decision coefficient $r_D^2$ is greater than a preset lower limit $L_{RD}^2$ and the condition that the difference ($S_D$−1) of the slant $S_D$ of the regression line and 1 is in a preset allowable range are satisfied, it is determined that the two CMOS integrated circuits resemble each other in vector waveform and the CMOS integrated circuit under test can be sorted out as defect-free.

Determination of Defect or Defect-free—5 (Two-Point Test Method)

With a functional test of CMOS integrated circuits, it is possible to detect about 60 to 80 percent of the defects by the measured value of the first vector point. Therefore, a standby test based on measurement of one point (one vector point) is often performed.

Below, an explanation will be made of a two-point test method for testing CMOS integrated circuits based on the measured values of two vector points.

The reference value $W_{L12}$ obtained by dividing the difference ($I_{Li}$−$IL2$) between the measured value $I_{L1}$ at the first point and the measured value $I_{L2}$ at the second point by the mean value $I_l$ in a defect-free CMOS integrated circuit is expressed by the following equation (34). Note that the reference value $W_{L12}$ corresponds to a yardstick of the extent of variability of the measured values $I_{L1}$ and $I_{L2}$.

$$W_{L12}=(I_{L1}-I_{L2})/I_l \tag{34}$$

The above equation (34) can be modified as in the following equation (35) using equations (1) and (2).

$$W_{L12} \{(R_1 \cdot Ip+I_{AL})-(R_2 \cdot Ip+I_{AL})\}/(Ip+I_{AL})$$

$$=(R_1-R_2) \cdot Ip/(Ip+I_{AL}) \tag{35}$$

When $I_{AL}$ is 0 or substantially 0 in the above equation (35), the following equation (36) is obtained.

$$W_{L12}=R_1-R_2 \tag{36}$$

In this way, the reference value $W_{L12}$ becomes the difference of the proportional coefficients $R_i$ and $R_2$ and becomes a constant value, so the reference value $W_{L12}$ can be found in advance from the measured values $I_{L1}$ and $I_{L2}$ of a defect-free CMOS integrated circuit.

When the measured value $I_{Qi}$ of the quiescent power supply current of a CMOS integrated circuit includes a defect current, the comparative value $W_{Q12}$ obtained by dividing the difference ($I_{Q1}-I_{Q2}$) of the measured value $I_{Q1}$ at the first point and the measured value $I_{Q2}$ at the second point by the mean value Iq is expressed by the following equation (37).

$$W_{Q12}=(I_{Q1}I_{Q2})/\text{Iq} \tag{37}$$

The above equation (37) can be modified as in the following equation (38) using equation (3).

$$W_{Q12}=\{(I_{L1}+I_{RD1}+I_{SD})-(I_{L2}+I_{RD2}+I_{SD})\}/\text{Iq}$$

$$=(I_{L1}-I_{L2}+I_{RD1}-I_{RD2})/\text{Iq} \tag{38}$$

When $I_{rd}$ is 0 or substantially 0 in equation (24), that is, when $I_{RD1}=I_{RD2}=0$, the mean value Iq becomes $I_l+I_{SD}$. By substituting this mean value Iq in the above equation (38), the following equation (39) is obtained.

$$W_{Q12}=(I_{L1}-I_{L2})/(I_l+I_{SD}) \tag{39}$$

From the above equation (39) and equation (34), the following equation (40) is obtained.

$$W_{Q12}<W_{L12} \tag{40}$$

On the other hand, when $I_{SD}$ is 0 or substantially 0 in equation (24), the mean value Iq becomes $I_l+I_{rd}$. Further, when $I_{rd} \ll I_l$, Iq$\approx I_l$. It is possible to modify the above equation (38) to the following equation (41) using the equation of this mean value Iq.

$$W_{Q12}(I_{L1}-I_{L2})/I_t+(I_{RD1}-I_{RD2})/I_t$$

$$=W_{L12}+(I_{RD1}=I_{RD2})/I_t \quad (41)$$

According to the above equation (41), the relative magnitudes of the value $W_{Q12}$ and $W_{L12}$ change according to the relative magnitudes of the defect currents $I_{RD1}$ and $I_{RD2}$. From these relationships, the condition for a defect-free circuit may be made that the difference between the reference value $W_{L12}$ and the comparative value $W_{Q12}$ ($W_{Q12}-W_{L12}$) be within a preset allowable range. The condition for a defect-free device can be expressed using the upper limit $T_{12}$.

$$|W_{Q12}W_{L12}|<T_{12} \quad (42)$$

Tester

Figure 9:
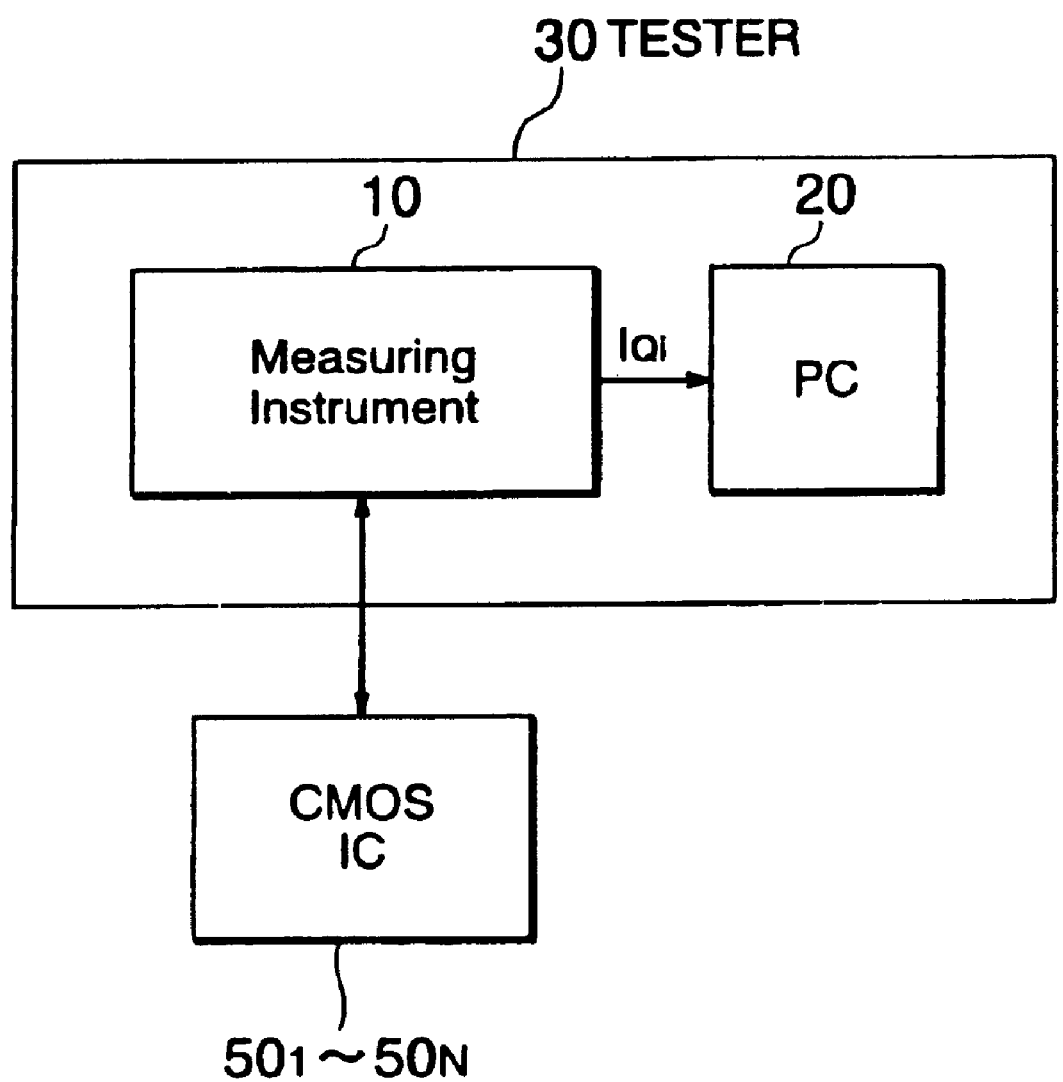
FIG. 9 is a view showing a configuration of a tester using the method of determination of a defect-free CMOS integrated circuit of an embodiment according to the present invention.

FIG. 9 is a view of showing the configuration of a tester for carrying out the method of determination of a defect-free CMOS integrated circuit according to the present invention. This tester 30 has a measuring instrument 10 and a computer 20 and conducts a functional test on the CMOS integrated circuits $50_1$ to $50_N$.

The measuring instrument 10 measures the quiescent power supply current $I_{DDQ}$ for the CMOS integrated circuits $50_1$ to $50_N$ for each of the vector points i and supplies the measured value $I_{Qi}$ to the computer 20.

The computer 20 has a control device, a storage device, an input device, and an output device. The control device of the computer 20 processes the measured value $I_{Qi}$ from the measuring instrument 10 in various ways, determines defect (defect or defect-free) and inspects the resemblance of the CMOS integrated circuits $50_1$ to $50_N$ based on the results of processing, and outputs the results of determination of defect (defect or defect-free) and the results of inspection of resemblance to the output device.

Access to the storage device of the computer 20 is controlled by the control device. This storage device stores the measured values of the defect-free CMOS integrated circuits and the measured value $I_{Qi}$ of the vector points i of the CMOS integrated circuits $5_1$ to $50_N$. Note that the storage device may also be configured to store in advance the measured value $I_{Li}$ of defect-free CMOS integrated circuits before measuring the quiescent power supply current $I_{DDQ}$ of the CMOS integrated circuits $50_1$ to $50_N$.

Method of Determination of Defect-free Device

Next, the method of determination of a defect-free CMOS integrated circuit will be explained by the method of selection out a defect-free circuit and the method of determination of defect (defect or defect-free).

In the method of selection out a defect-free circuit, a defect-free circuit is sorted out from a group of CMOS integrated circuits under test based on the measured value $I_{Qi}$ of the quiescent power supply current for the CMOS integrated circuits under test (DUT).

On the other hand, in the method of determination of defect (defect of defect-free), it is determined if a CMOS integrated circuit under test is a defect-free circuit based on the measured value $I_{Li}$ of quiescent power supply current of defect-free CMOS integrated circuits and the measured value $I_{Qi}$ of quiescent power supply current of the CMOS integrated circuit under test. The defect-free CMOS integrated circuits are defined for example as defect-free CMOS integrated circuits obtained by the method of selection out a defect-free circuit.

Method of Selection out Defect-free Devices

Figure 10:
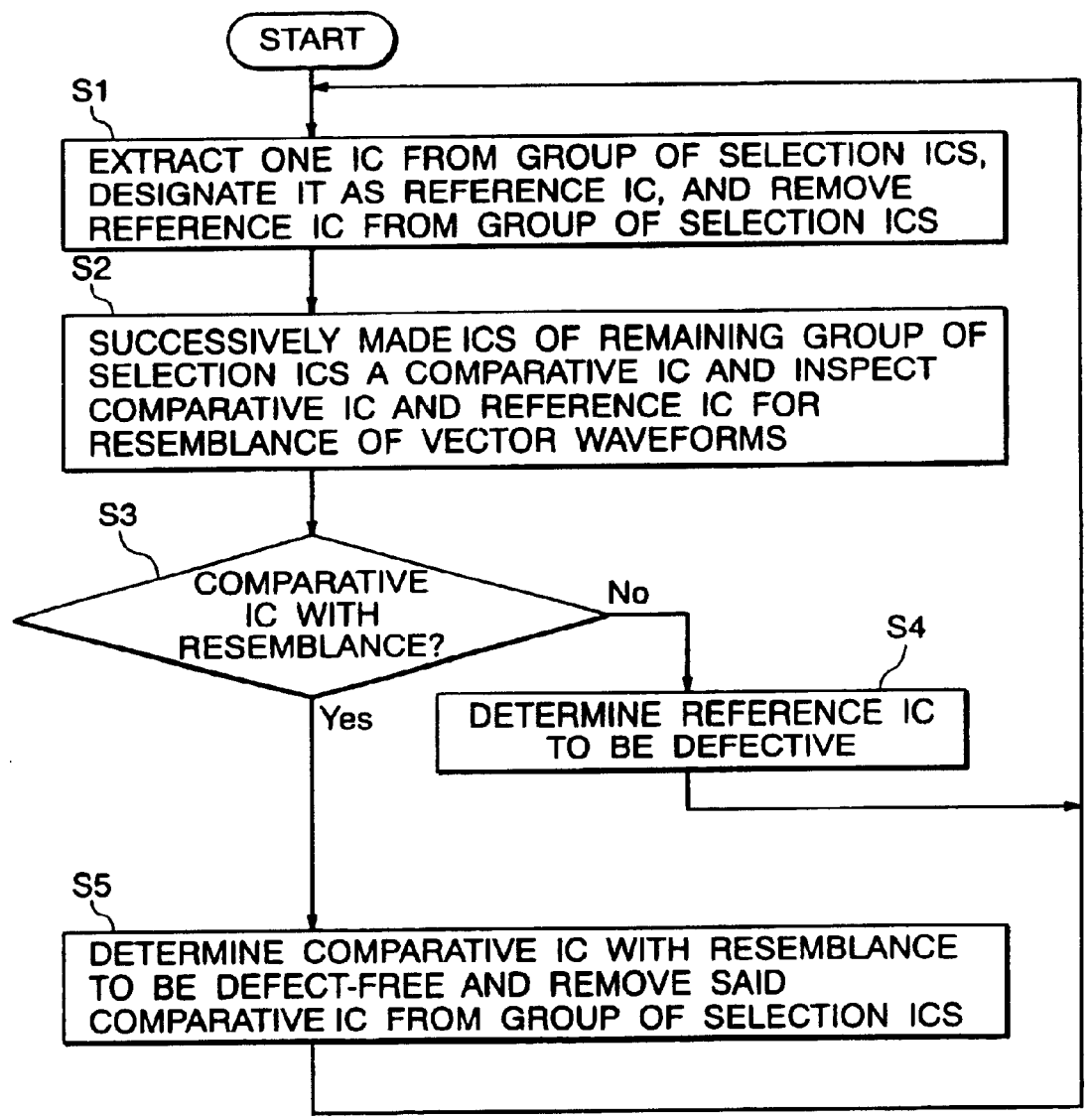
FIG. 10 is a flow chart of computer processing in the tester of FIG. 9 and shows an embodiment of a method for selection out defect-free CMOS integrated circuits.

FIG. 10 is a flow chart of processing of the computer 20 in the tester 30 of FIG. 9 and shows an embodiment of the method of selection out a defect-free CMOS integrated circuit. Note that at the start stage, it is assumed that the measured values $I_{Qi}$ of quiescent power supply current of the CMOS integrated circuits $50_1$ to $50_N$ have been obtained.

Step 1: Provisional Selection of Reference IC

At step S1, one CMOS integrated circuit is extracted from the group of CMOS integrated circuits $50_1$ to $50_N$ to be sorted (group of selection ICs) and designated as the reference IC. This reference IC is removed from the group of selection ICs.

Step 2: Resemble Test

At step S2, the remaining devices of the group of selection ICs are successively designated as comparative ICs and inspected for resemblance of vector waveforms with the reference IC.

Step 3: Comparison

At step S3, it is determined if there is a comparative IC with a resembling vector waveform in the group of selection ICs inspected for resemblance.

Step 4: determination

When there is no comparative IC having a resembling vector waveform, the routine proceeds to step S4, where it is determined that the reference IC is defective.

When there is a comparative IC having a resembling vector waveform, the routine proceeds to step S5, where it is determined that the comparative IC is defect-free and that comparative IC is removed from the group of selection ICs.

These steps S1 to S5 are repeated until the number of remaining circuits of the group of selection ICs becomes 1 or 0 so as to thereby enable selection out of defect-free devices.

Note that at step S5, by collecting the comparative ICs for each reference IC, it is possible to classify the defect-free circuits by the differences in waveforms.

FIRST EXAMPLE OF RESEMBLE TEST

Figure 11:
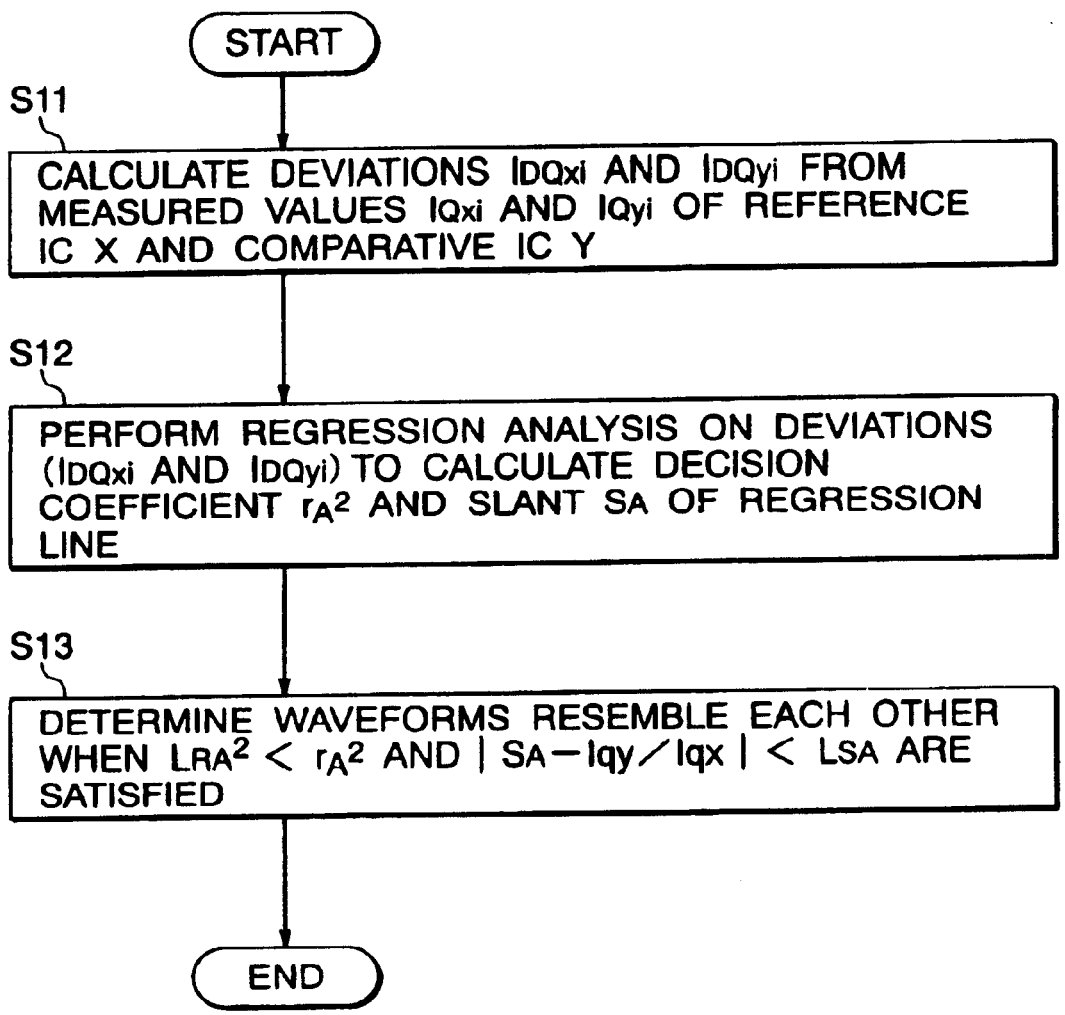
FIG. 11 is a flow chart of a first embodiment of processing for inspection of resemblance.

FIG. 11 is a flow chart of a first embodiment of processing for inspection of resemblance at step S2 of FIG. 10.

First, at step S11, the deviation $I_{DQxi}$ ($=I_{Qxi}-Iqx$) is calculated for the measured value $I_{Qxi}$ of the quiescent power supply current of the reference IC and the deviation $I_{DQyi}$ ($=I_{Qyi}-Iqy$) is calculated based on the measured value $I_{Qyi}$ of the quiescent power supply current of the comparative IC.

Here, Iqx is the mean value obtained by averaging the measured value $I_{Qxi}$ for all vector points n, while Iqy is the mean value obtained by averaging the measured value $I_{Qyi}$ for all vector points n.

At step S12, regression analysis is performed on the deviations ($I_{DQxi}$ and $I_{DQyi}$) to obtain a regression line.

A gradient $S_A$ of the regression line is obtained by, for example, a root mean square, and a predicted quiescent power supply current $I_{Hi}$ is calculated by using the gradient $S_A$ and the regression line expressed by the formula (7-2).

A decision coefficient $r_A^2$ is calculated by the formula (7).

At step S13, when $L_{RA}^{2<r}{}_A^2$ and $|S_A-Iqy/Iqx|<L_{SA}$, it is determined that the vector waveforms of the comparative IC and reference IC resemble each other.

Here, $L_{RA}^2$ is the lower limit of the decision coefficient $r_A^2$, while $L_{SA}$ is the upper limit corresponding to the allowable range of deviation from the slant $S_A$.

SECOND EXAMPLE OF RESEMBLE TEST

Figure 12:
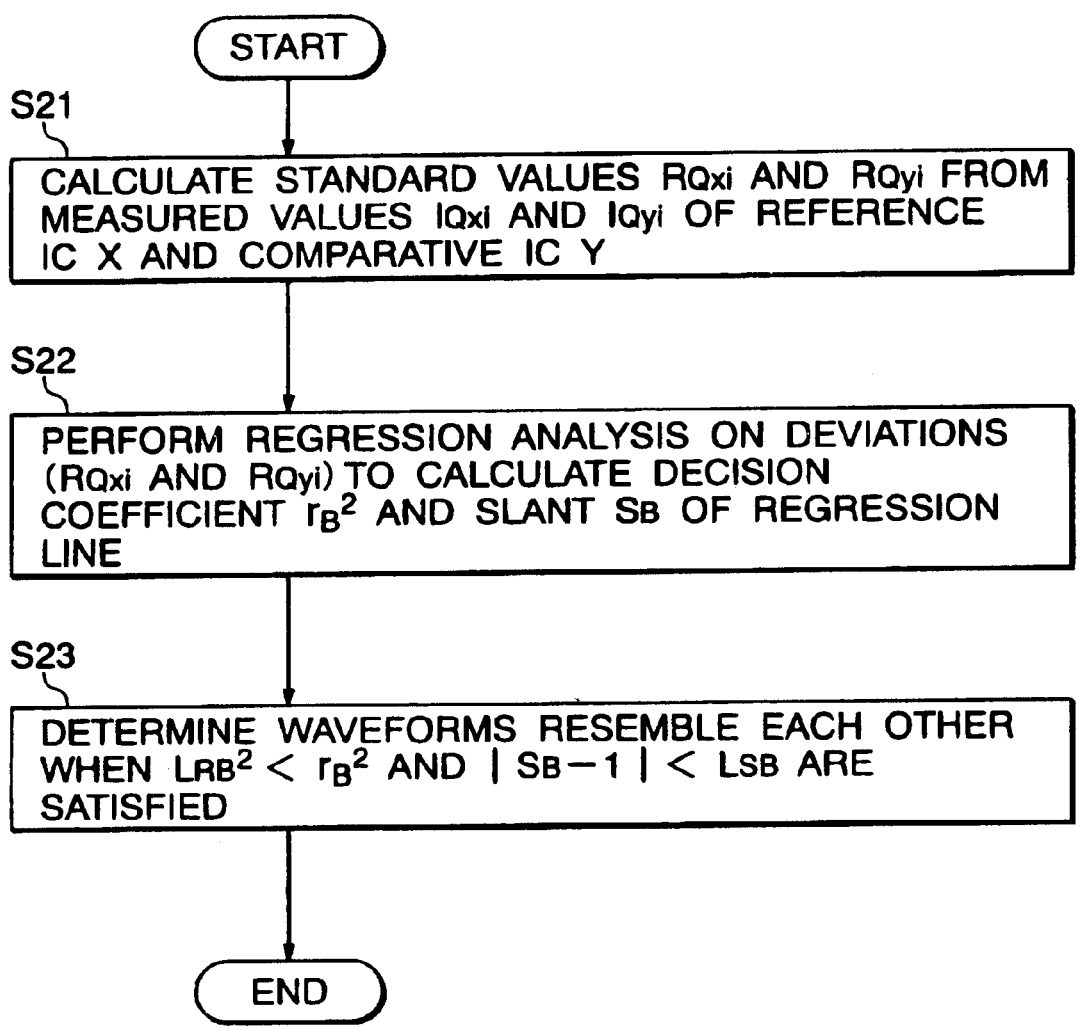
FIG. 12 is a flow chart of a second embodiment of processing for inspection of resemblance.

FIG. 12 is a flow chart of a second embodiment of processing for inspection of resemblance at step S2 of FIG. 10.

First, at step S21, the normalized value $R_{Qxi}=(I_{Qxi}-Iqx)/\sigma_{Qx}$ is calculated based on a measured value $I_{Qxi}$ of the quiescent power supply current of the reference IC, while the normalized value $R_{Qyi}=(I_{Qyi}-Iqy)/\sigma_{Qy}$ is calculated based on the measured value $I_{Qyi}$ of the quiescent power supply current of the comparative IC.

Here, $\sigma_{Qx}$ is the standard deviation of the measured value $I_{Qxi}$, while $\sigma_{Qy}$ is the standard deviation of the measured value $I_{Qyi}$.

At step S22, regression analysis is performed on the normalized values ($R_{Qxi}$ and $R_{Qyi}$) to obtain a regression line.

A gradient $S_B$ of the regression line is obtained by, for example, a root mean square, and a predicted normalized value $R_{Hi}$ is calculated by using the gradient $S_B$ and the regression line expressed by the formula (7-2).

A decision coefficient $r_B^2$ is calculated by the formula (7A).

At step S23, when $L_{RB}^2 < r_B^2$ and $|S_B - I| < L_{SB}$, it is determined that the vector waveforms of the comparative IC and reference IC resemble each other.

Here, $L_{RB}^2$ is the lower limit of the decision coefficient $r_B^2$, while $L_{SB}$ is the upper limit corresponding to the allowable range of deviation from the slant $S_B$.

THIRD EXAMPLE OF RESEMBLE TEST

Figure 13:
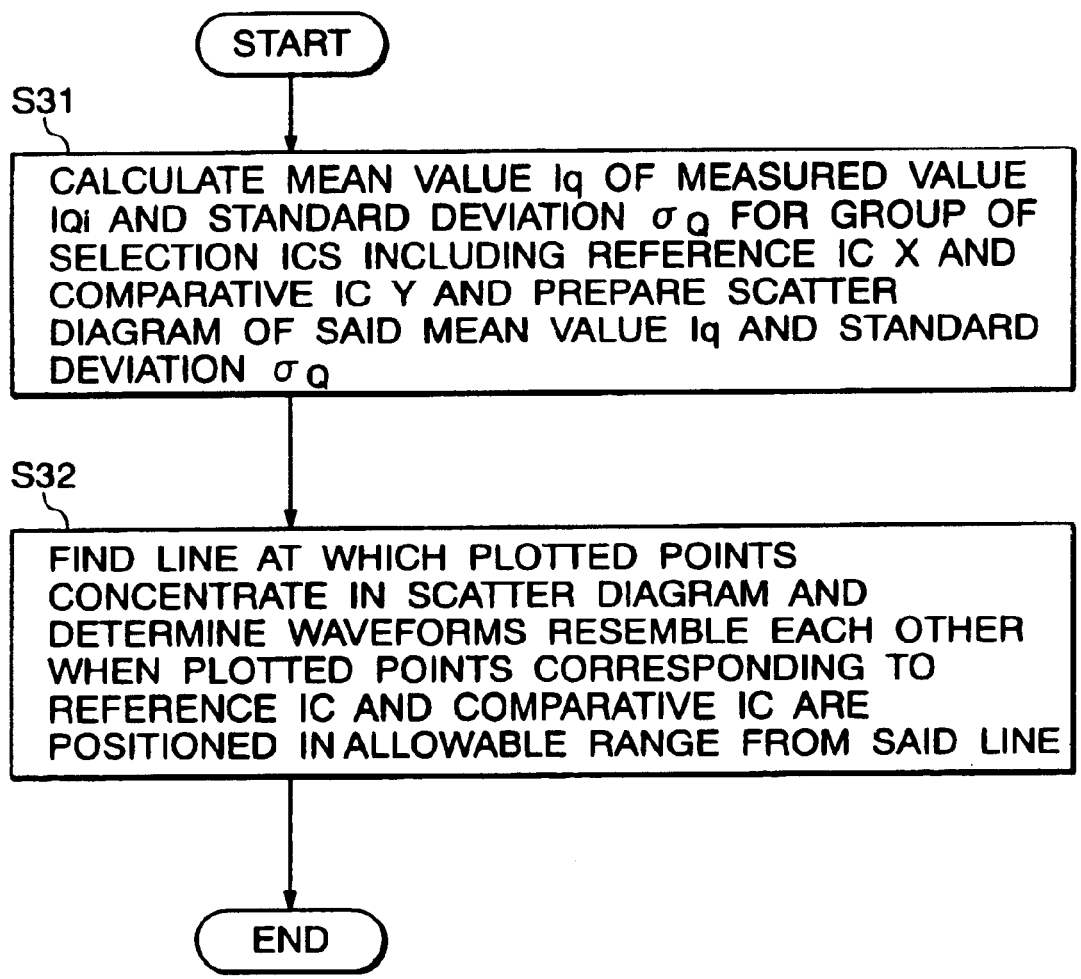
FIG. 13 is a flow chart of a third embodiment of processing for inspection of resemblance.

FIG. 13 is a flow chart of a third embodiment of the processing for inspection for resemblance at step S2 of FIG. 10.

First, at step S31, the mean values Iq and standard deviations $\sigma_Q$ of measured values of quiescent power supply current of a group of selection ICs including the reference IC and comparative ICs are calculated and a plotted graph of (Iq and $\sigma_Q$) is prepared. For example, a plotted graph having an abscissa indicating the mean value Iq and an ordinate indicating the standard deviation $\sigma_Q$ and including plotted points indicating the (Iq and $\sigma_Q$) of the CMOS integrated circuits is prepared.

At step S32, the line where the plotted points concentrate in the plotted graph is found. When the two plotted points corresponding to the reference IC and comparative IC are positioned in an allowable range from that line (for example, within a predetermined distance), it is determined that the waveforms of the reference IC and comparative IC resemble each other.

Note that the flow chart of FIG. 13 can be used when extracting defect-free CMOS integrated circuits from the group of selection ICs.

For example, the mean values Iq and standard deviations $\sigma_Q$ of the measured values $I_{Qi}$ of the group of selection ICs are calculated, a plotted graph of (Iq and $\sigma_Q$) is prepared, and it is determined that the CMOS integrated circuit corresponding to a plot positioned in an allowable range from the line where the plotted points concentrate in the plotted graph is defect-free.

FOURTH EXAMPLE OF RESEMBLE TEST

Figure 14:
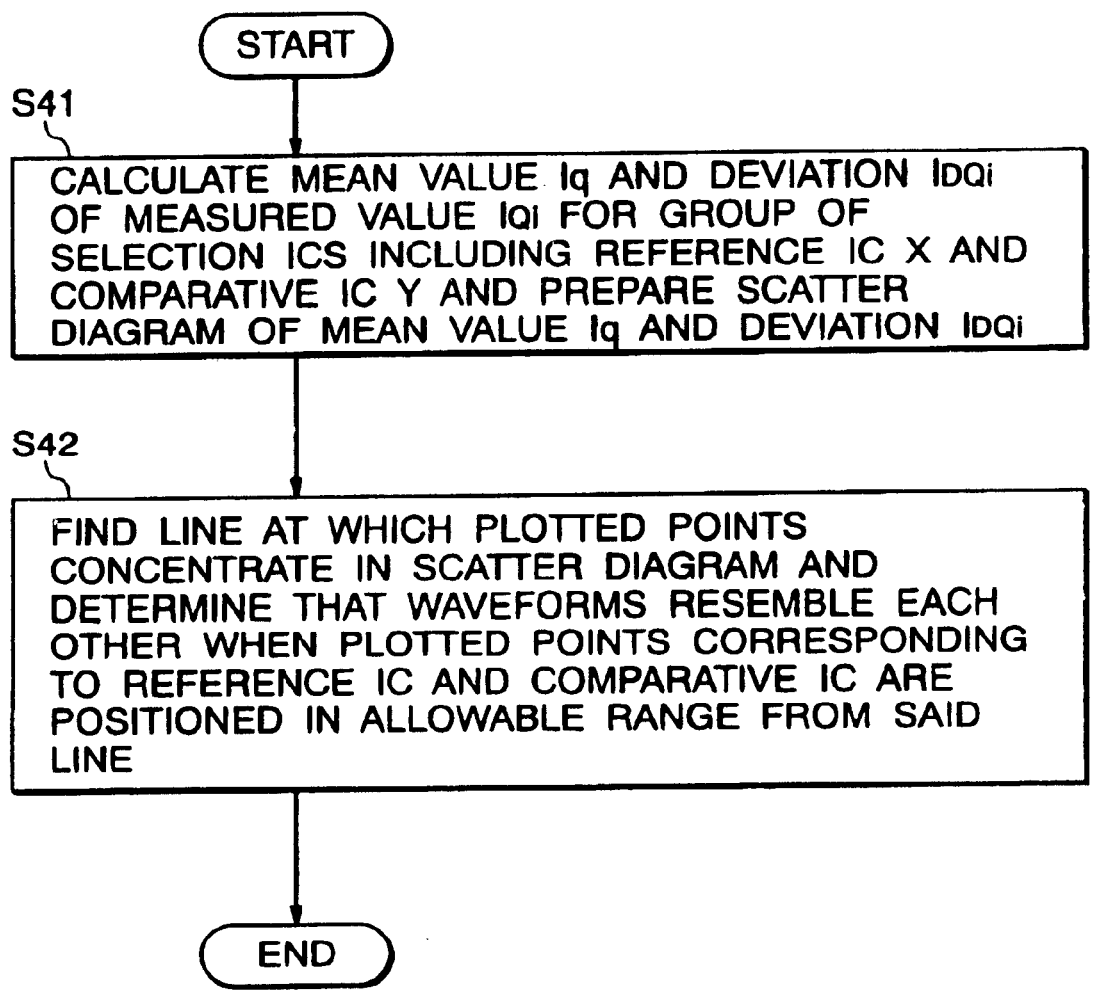
FIG. 14 is a flow chart of a fourth embodiment of processing for inspection of resemblance.

FIG. 14 is a flow chart of a fourth embodiment of the processing for inspection of resemblance at step S2 in FIG. 10.

First, at step S41, the mean values Iq and deviations $I_{DQi}$ of the measured values of the quiescent power supply current of the group of selection ICs including the reference IC and comparative ICs are calculated and a plotted graph of (Iq and $I_{DQi}$) is prepared. For example, a plotted graph having an abscissa indicating the mean value Iq and an ordinate indicating the deviation $I_{DQi}$ and including plotted points indicating (Iq and $I_{DQi}$) of the CMOS integrated circuits is prepared.

At step S42, the line where the plotted points concentrate in the plotted graph is found. When the two plotted points corresponding to the reference IC and comparative IC are positioned in an allowable range from that line (for example, within a predetermined distance), it is determined that the waveforms of the reference IC and comparative IC resemble each other.

Note that the flow chart of FIG. 14 can be used when extracting defect-free CMOS integrated circuits from the group of selection ICs.

For example, the mean values Iq and standard deviations $I_{DQi}$ of the measured values $I_{Qi}$ of the group of selection ICs are calculated, a plotted graph of (Iq and $I_{DQi}$) is prepared, and it is determined that a CMOS integrated circuit corresponding to a plot positioned in an allowable range from the line where the plotted points concentrate in the plotted graph is defect-free.

Method of Determination of Defect or Defect-free

Preferred embodiments of the determination of defect-free or defect IC will be described.

First Embodiment of Determination

FIG. 15 is a flow chart of a first embodiment of a method of determination of defect (defect or defect-free). This method of determination of defect determines that an integrated circuit device under test (DUT) is defect-free when the computer 20 of the tester 30 of FIG. 9 holds the measured values $I_{Li}$ of defect-free CMOS integrated circuits.

First, at step S51, the coefficients $K_{Li}=(I_{Li}-I_I)/I_I$ at all of the vector points i are calculated from a group of defect-free CMOS integrated circuits (group of ICs) and the coefficients $K_{Li}$ are averaged for the group of defect-free ICs to calculate a reference coefficient $K_{Ni}$. Note that the coefficients $K_{Li}$ are values obtained by normalizing the deviation ($I_{Li}-I_I$) of the measured value $I_{Li}$ by the mean value $I_I$.

The calculation of the average coefficient $K_{Ni}$ from the plurality of the coefficients $K_{Li}$ is intended to increase an accuracy of the coefficient $K_{Ni}$. Therefore, the coefficient $K_{Li}$ of one reference CMOS IC can be applied in the following descriptions and equations.

At step S52, the deviation $I_{DQi}=I_{Qi}-Iq$ is calculated from a measured value $I_{Qi}$ of the quiescent power supply current of the IC device under test (DUT).

At the step S53, the regression analysis is performed on the coefficient $K_{Ni}$ and the deviation $I_{PQi}$ of the measured quiescent power supply current $I_{Qi}$, to obtain a regression line. A gradient $S_C$ of the regression line is obtained by, for example, a root mean square, and a predicted coefficient $K_{Hi}$ is calculated by using the gradient $S_C$ and the regression line expressed by the formula (7-2).

A decision coefficient $R_C^2$ is calculated by the formula (7B).

At step S54, when $L_{RC}^2 < r_C^2$ and $|S_C/Iq - 1| < L_{SC}$ are satisfied, it is determined that the IC device under test is defect-free, while when they are not satisfied, it is determined that the device under test is defective.

Here, $L_{RC}^2$ is the lower limit of the decision coefficient $R_{C2}$, while $L_{SC}$ is the upper limit corresponding to the allowable range of deviation from the slant $S_C$.

Second Embodiment of Determination

Figure 16:
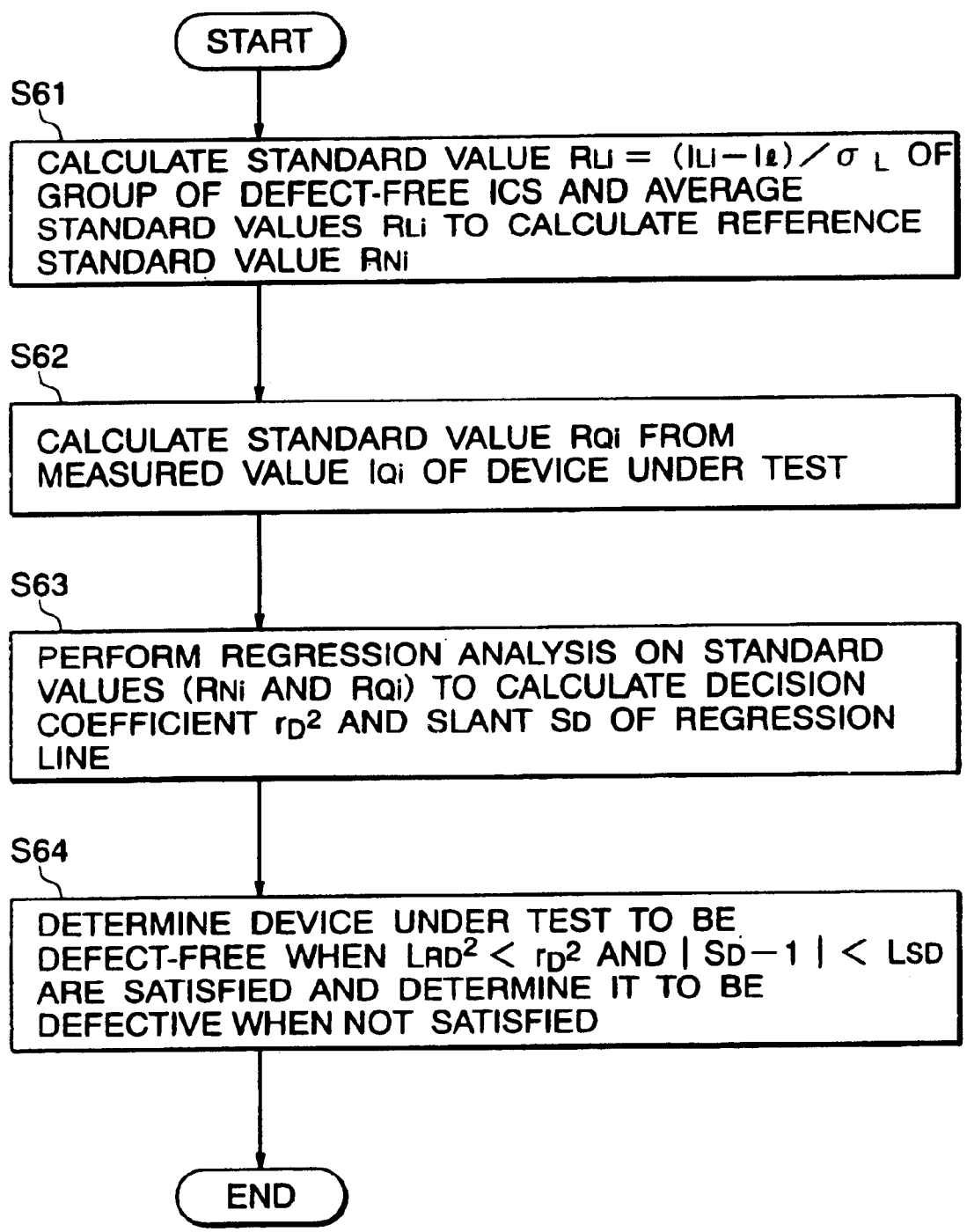
FIG. 16 is a flow chart of computer processing in the tester in FIG. 9 and shows a second embodiment of a method for determining defect of a CMOS integrated circuit.

FIG. 16 is a flow chart of a second embodiment of the method of determination of defect (defect or defect-free). This method of determination of defect determines that an IC device under test (DUT) is defect-free when the computer 20 of the tester 30 of FIG. 9 holds the measured values $I_{Li}$ of defect-free CMOS integrated circuits.

First, at step S61, the normalized values $R_{Li}=(I_{Li-I1})/\sigma_L$ at all of the vector points i are calculated from a group of defect-free CMOS integrated circuits (IC group), and the normalized values $R_{Li}$ are averaged for the group of defect-free ICs to calculate an average normalized value $R_{Ni}$.

The normalized value $R_{Li}(=(L_{Li}-I_1)/\sigma_I)$ is a normalized value of the normal leakage current deviation $I_{PLi}$ by the standard variation $\sigma_1$ of $I_{Li}$.

The calculation of the average normalized value $R_{Ni}$ from the plurality of the coefficients $K_{Li}$ is intended to increase an accuracy of the normalized value $R_{Ni}$. Therefore, the normalized value $R_{Li}$ of one reference CMOS IC can be applied in the following descriptions and equations.

At step S62, the normalized value $R_{Qi}=(I_{Qi}-Iq)/\sigma_Q$ is calculated from the measured value $I_{Qi}$ of the quiescent power supply current of the IC device under test (DUT).

At the step S62, the regression analysis is performed on the coefficient $K_{Ni}$ and the deviation $I_{PQi}$ of the measured quiescent power supply current $I_{Qi}$, to obtain a regression line. A gradient $S_D$ of the regression line is obtained by, for example, a root mean square, and a predicted normalizes value $R_{Ni}$ is calculated by using the gradient $S_D$ and the regression line expressed by the formula (7-2).

A decision coefficient $r_D^2$ is calculated by the formula (7B).

At step S64, when $L_{RD}^2 < r_D^2$ and $|S_D-1| < L_{SD}$ are satisfied, it is determined that the IC device under test is defect-free, while when they are not satisfied, it is determined that it is defective.

Here, $L_{RD}^2$ is the lower limit of the decision coefficient $r_D^2$, while $L_{SD}$ is the lower limit corresponding to the allowable range of deviation from the slant $S_D$.

Third Embodiment of Determination

Figure 17:
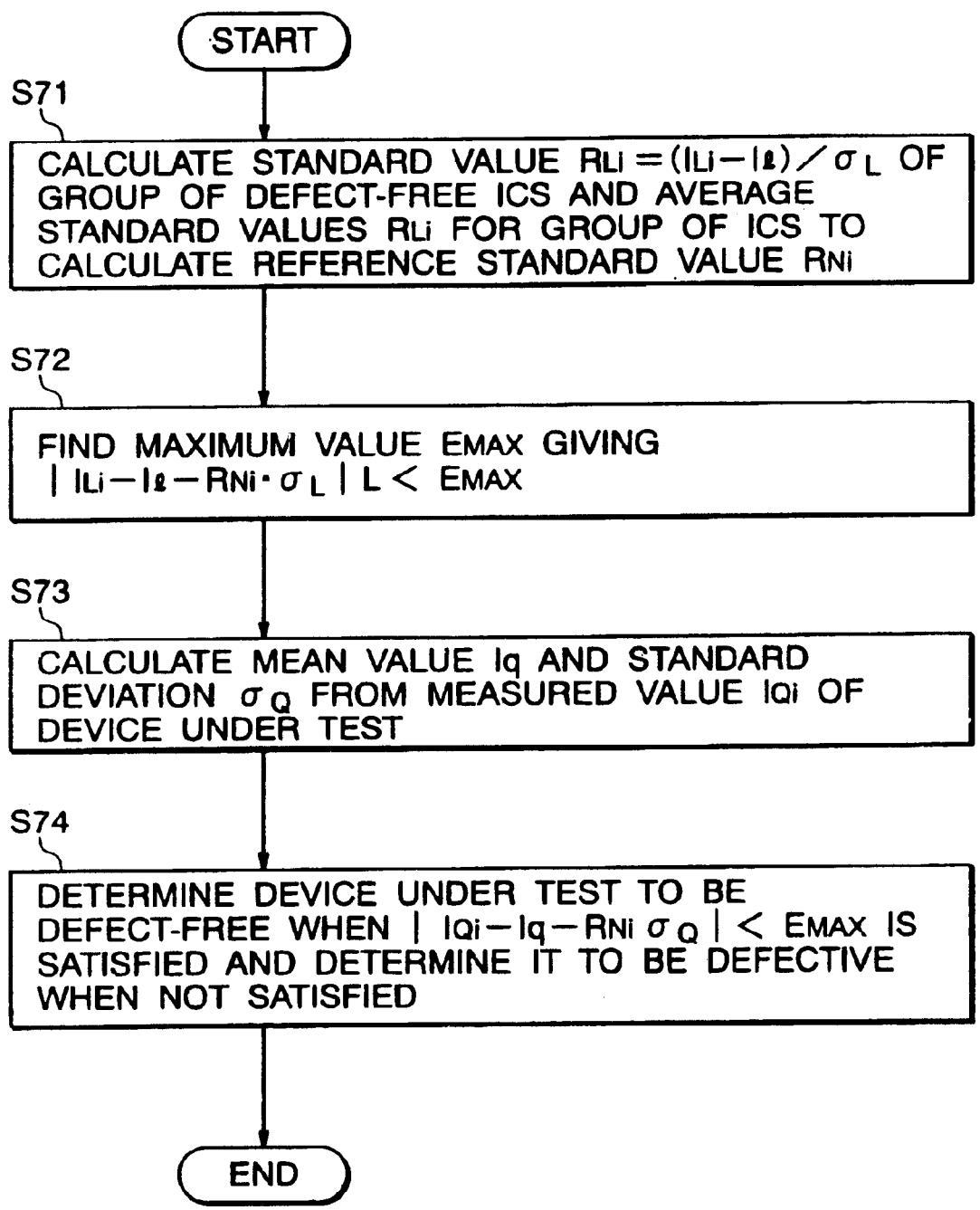
FIG. 17 is a flow chart of computer processing in the tester in FIG. 9 and shows a third embodiment of a method for determining defect of a CMOS integrated circuit.

FIG. 17 is a flow chart of a third embodiment of the method of determination of defect. This method of determination of defect (defect or defect-free) determines that a device under test (DUT) is defect-free when the computer 20 of the tester 30 of FIG. 9 holds the measured values $I_{Li}$ of defect-free CMOS integrated circuits.

First, at step S71, the normalized values $R_{Li}=(I_{Li}-I_l)/\sigma_L$ at all of the vector points i are calculated from a group of defect-free CMOS integrated circuits (IC group), and the normalized values $R_{Li}$ are averaged for the group of defect-free ICs to calculate an average normalized value $R_{Ni}$.

The calculation of the average normalized value $R_{Nc}$ from the plurality of the coefficients $R_{Li}$ is intended to increase an accuracy of the value $R_{Li}$. Therefore, the value $R_{Li}$ of one reference CMOS IC can be applied in the following descriptions and equations.

At step S72, a maximum value $E_{MAX}$ giving $|I_{Li}-I_l \cdot R_{Ni \cdot oL}|_{<EMAX}$ is found.

At step S73, the mean value Iq and standard deviation $\sigma_Q$ are calculated from the measured value $I_{Qi}$ of the IC device under test.

At step S74, when $|I_{Qi}-Iq-R_{Ni} \cdot \sigma_Q| < E_{MAX}$ is satisfied, it is determined that the IC device under test is defect-free, while when it is not satisfied, it is determined that the IC device under test is defective.

Fourth Embodiment of Determination

Figure 18:
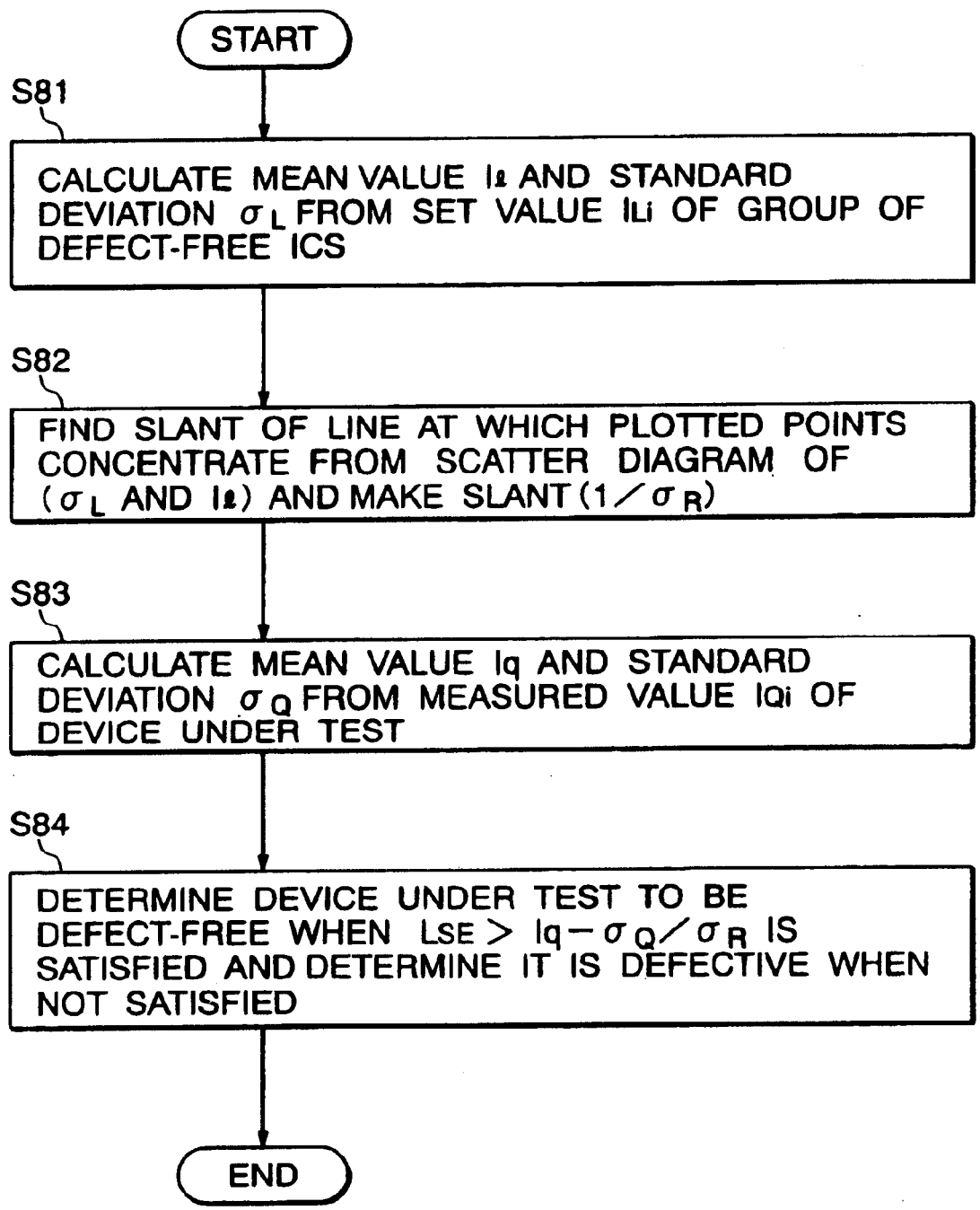
FIG. 18 is a flow chart of computer processing in the tester in FIG. 9 and shows a fourth embodiment of a method for determining defect of a CMOS integrated circuit.

FIG. 18 is a flow chart of a fourth embodiment of the method of determination of defect (defect of defect-free). This method of determination of defect determines that an IC device under test (DUT) is defect-free when the computer 20 of the tester 30 of FIG. 9 holds the measured values $I_{Li}$ of defect-free CMOS integrated circuits.

First, at step S81, the mean values $I_l$ and the standard deviations $\sigma_L$ are calculated for a group of defect-free CMOS integrated circuits (IC group).

At step S82, a plotted graph of ($\sigma_L$ and $I_l$) is prepared, the slant of the line at which the plotted points concentrate is found, and that slant is made ($1/\sigma_R$). For example, a plotted graph having an abscissa (x-axis) showing the standard deviation $\sigma_L$ and an ordinate (y-axis) showing the mean value $I_l$ and including plotted points showing the standard deviation $\sigma_L$ and mean value $I_l$ is prepared.

At step S83, the mean value Iq and standard deviation $\sigma_Q$ are calculated from measured value $I_{Qi}$ of the IC device under test.

At step S84, when $Iq-\sigma_Q/\sigma_R < L_{SE}$ is satisfied, it is determined that the IC device under test is defect-free, while when it is not satisfied, it is determined that the IC device under test is defective. Note that $L_{SE}$ is the upper limit corresponding to the allowable range of error between a mean value Iq and the value $\sigma_Q/\sigma_R$.

Fifth Embodiment of Determination

Figure 19:
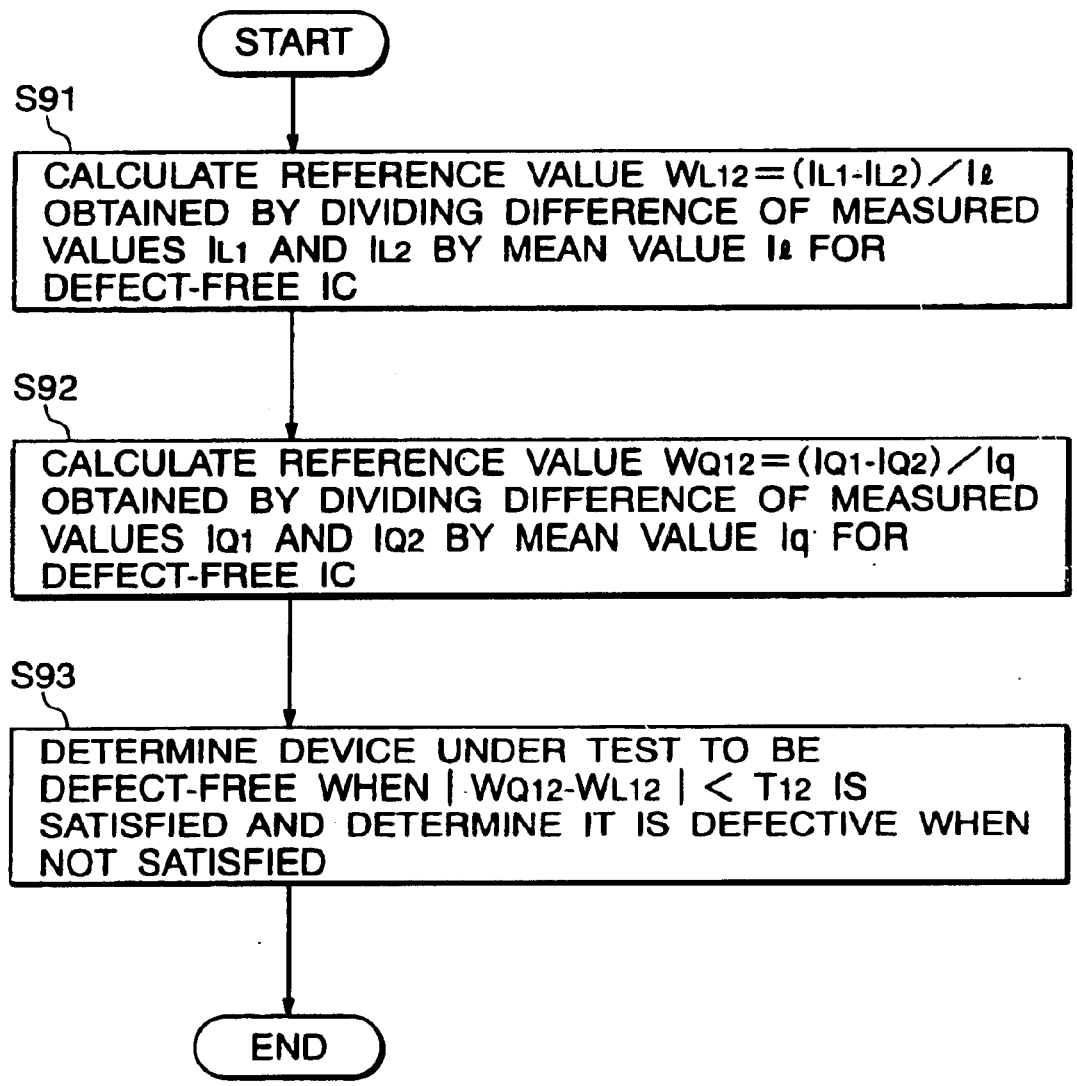
FIG. 19 is a flow chart of computer processing in the tester in FIG. 9 and shows a fifth embodiment of a method for determining defect of a CMOS integrated circuit.

FIG. 19 is a flow chart of a fifth embodiment of the method of determination of defect. This method of determination of defect determines that a device under test (DUT) is defect-free when the computer 20 of the tester 30 of FIG. 9 holds measured values $I_{L1}$ and $I_{L2}$ of two vector points of a defect-free CMOS integrated circuit.

First, at step S91, the reference value $W_{L12}=(I_{Li}-I_{L2})/I_l$ obtained by dividing the difference of the measured values $I_{L1}$ and $I_{L2}$ by the mean value $I_l$ is calculated for a defect-free CMOS integrated circuit.

At step S92, a comparative value $W_{Q12}=(I_{Q1}-I_{Q2})/Iq$ obtained by dividing the difference of the measured values $I_{Q1}$ and $I_{Q2}$ of the two vector points by the mean value Iq is calculated for the IC device under test.

At step S93, when $|W_{Q12}-W_{L12}| < T_{12}$ is satisfied, it is determined that the IC device under test is defect-free, while when it is not satisfied, it is determined to be defective. Note that $T_{12}$ is the upper limit showing the allowable range of the difference between the comparative value $W_{Q12}$ and reference value $W_{L12}$.

Sixth Embodiment of Determination

Figure 20:
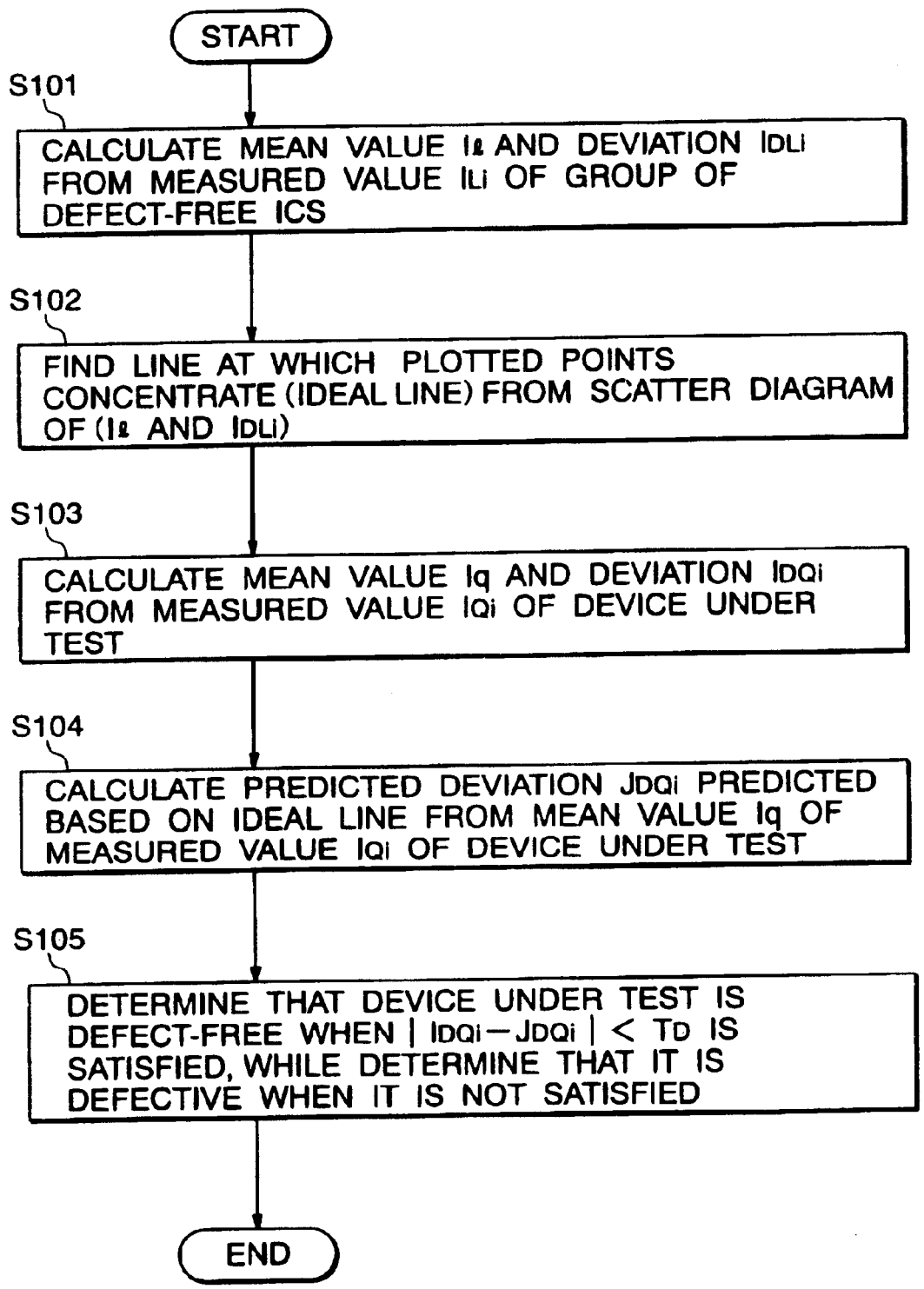
FIG. 20 is a flow chart of computer processing in the tester in FIG. 9 and shows a sixth embodiment of a method for determining defect of a CMOS integrated circuit.

FIG. 20 is a flow chart of a sixth embodiment of the method of determination defect or defect-free. This method of determination of defect determines that an IC device under test (DUT) is defect-free when the computer 20 of the tester 30 in FIG. 9 holds the measured values $I_{Li}$ of defect-free CMOS integrated circuits.

First, at step S101, the mean values $I_l$ and the deviations $I_{DL1}$ are calculated for each IC in a group of defect-free CMOS integrated circuits (IC group), and a total mean value and total deviations are calculated for the group of ICs.

The coefficient $K_{Li}(=(L_{Li}-I_1)/I_1)$ is a normalized value of the normal leakage current deviation $I_{PLi}$ by the average current $I_1$ of normal leakage current $I_{Li}$.

The calculation of the total average and total deviations is intended to increase an accuracy of the same. Therefore, the average and deviation of one reference CMOS IC can be applied in the following descriptions and equations.

At step S102, a plotted graph of ($I_l$ and $I_{DL1}$) is prepared and the line at which the plotted points concentrate (ideal line) is found. For example, a plotted graph having an abscissa (x-axis) showing the mean value $I_l$ and an ordinate (y-axis) showing the deviation $I_{DL1}$ and including plotted points showing the mean value $I_1$ and deviation $I_{DL1}$ is prepared. It is possible to find the ($R_i$−1) in equation (18) from the slant of the ideal line and possible to find the (1−$R_i$)·$I_{AL}$ in equation (18) from the y section from this plotted graph.

At step S103, the mean value Iq and deviation $I_{DQi}$=$I_{Qi}$−Iq are calculated from the measured value $I_{Qi}$ of the device under test.

At step S105, when |$I_{DQi}$−$J_{DQi}$|<$T_D$ is satisfied, it is determined that the IC device under test is defect-free, while when it is not satisfied, it is determined that the IC device under test is defective. Note that $T_D$ is the upper limit corresponding to the allowable range of error between a deviation $I_{DQi}$ and predicted deviation $J_{DQi}$.

In the above description, the CMOS IC is discussed as an example, however, the present invention can be applied a variety of semiconductor IC.

Summarizing the effects of the present invention, it is possible to provide a method and apparatus for determination of a defect-free CMOS integrated circuit enabling determination of a defect-free state without regard as to the presence of a circuit leakage current.

While the invention has been described with reference to specific embodiments chosen for purpose of illustration, it should be apparent that numerous modifications could be made thereto by those skilled in the art without departing from the basic concept and scope of the invention.

What is claimed is:

1. A method of determining a defect-free or defective semiconductor integrated circuit, comprising:
    a first measurement step for measuring a quiescent power supply current (QPSC) of a first semiconductor integrated circuit (IC) a plurality of times in a predetermined interval after operation of the first IC has stopped;
    a first data calculation step for calculating a first feature data indicating a feature(s) of the measured QPSCs of the first IC;
    a second measurement step for measuring a QPSC of a second semiconductor IC a plurality of times in the same condition as that of the first IC after operation of the second IC has stopped;
    a second data calculation step for calculating a second feature data indicating a feature(s) of the measured QPSCs of the second IC; and
    a comparison and determination step for comparing a resemblance-between the first feature data and the second feature data, and determining the first and second ICs as defect-free ICs when the resemblance is high or the first and second ICs as defective ICs when the resemblance is low.

2. A method according to claim 1, wherein the first and second ICs are formed on the same semiconductor wafer.

3. A method according to claim 2, wherein the IC comprises a complementary metal oxide semiconductor (CMOS) IC.

4. A method according to claim 1, wherein
one of the first and second ICs is decided as a reference IC;
the second measurement step and the second calculation step are carried out for another semiconductor IC as the second IC; and
in the comparison and determination step, the second IC is determined as a defect-free IC when the resemblance is high, or as a defective-IC when the resemblance is low.

5. A method according to claim 1, wherein
in the first data calculation step, a first average QPSC of the measured QPSCs of the first IC and a first plurality of QPSC deviations of the measured QPSCs of the first IC, which are the measured QPSCs of the first IC minus the first average, are calculated;
in the second data calculation step, a second average QPSC of the measured QPSCs of the second IC and a second plurality of QPSC deviations of the measured QPSCs of the second IC, which are the measured QPSCs of the second IC minus the second average, are calculated; and
the method further comprising a third data calculation step for performing a first regression analysis on the first plurality of QPSC deviations and the second plurality of QPSC deviations to produce a first regression line and calculating a gradient of the first regression line, performing a second regression analysis on the measured QPSCs of the first IC to produce a second regression line and calculating a predicted QPSC, and calculating a decision coefficient defined by the following formula:

$$1 - \frac{\sum(\text{measured } QPSCs \text{ of the second } IC - \text{predicted } QPSC)^2}{\sum(\text{second deviation})^2}$$

wherein, in the comparison and determination step, the first and second ICs resemble one another when the decision coefficient is greater than a limit value, and the deviation of the gradient and the ratio is in a predetermined range.

6. A method according to claim 1, where in
in the first data calculation step, a first average QPSC of the measured QPSCs of the first IC, a first standard deviation of the measured QPSCs of the first IC, and first normalized values defined as (the measured QPSCs of the first IC−the first average)/the first standard deviation) are calculated; and
in the second data calculation step, a second average of the measured QPSCs of the second IC, a second standard deviation of the measured QPSCs of the first IC, and second normalized values defined as (the measured QPSCs of the second IC-the second average)/the second standard deviation) are calculated;
the method further comprising a third data calculation step for performing a first regression analysis on the first plurality of normalized values and the second plurality of normalized values to produce a first regression line and calculating a gradient of the first regression line, performing a second regression analysis on the first normalized values to produce a second regression line and calculating a predicted normalized value, calculating an average normalized value of the second plurality of normalized values, and calculating a decision coefficient defined by the following formula:

$$1 - \frac{\sum(\text{second standard values} - \text{predicted standard value})^2}{\sum(\text{second standard values} - \text{average standard value})^2}$$

wherein, in the comparison and determination step, the first and second ICs resemble one another when the decision coefficient is greater than a limit value, and the gradient is in a predetermined range.

7. A method according to claim 1, wherein
in the first data calculation step, a first average QPSC of the measured QPSCs of the first IC, a first standard deviation of the measured QPSCS of the first IC, and a first feature value defined by (the first average QPSC/the first standard deviation) are calculated;

in the second data calculation step, a second average QPSC of the measured QPSCS of the second IC, a second standard deviation of the measured QPSCs of the second IC, and a second feature value defined by (the second average QPSC/the second standard deviation) are calculated;

and in the comparison and determination step, the first and second ICs resemble one another when the first and second feature values are in a predetermined range.

8. A method according to claim 1, wherein
in the first data calculation step, a first average QPSC of the measured QPSCs of the first IC, first QPSC deviations, which are defined as the measured QPSCs of the first IC−minus the first average QPSC, and first feature values defined by (the first QPSC deviations/the first QPSC average) are calculated;

in the second data calculation step, a second average QPSC of the measured QPSCs of the second IC, second QPSC deviations, which are defined as the measured QPSCs of the second IC−minus the second average QPSC, and second feature values defined by (the second QPSC deviations/the second QPSC) are calculated; and in the comparison and determination step, the first and second ICs resemble one another when the first and second feature data are in a predetermined range.

9. An apparatus for determining a defect-free or defective-semiconductor integrated circuit, comprising:
a first measurement means for measuring a quiescent power supply current (QPSC) of a first semiconductor integrated circuit (IC), a plurality of times in a predetermined interval after operation of the first IC has stopped;

a first data calculation means for calculating a first feature data indicating a feature(s) of the measured QPSCS of the first IC;

a second measurement means for measuring a QPSC of a second semiconductor IC, a plurality of times in the same condition as that of the first IC after operation of the second IC has stopped;

a second data calculation means for calculating a second feature data indicating a feature(s) of the measured QPSCs of the second IC; and a comparison and determination means for comparing a resemblance between the first feature data and the second feature data, and determining the first and second ICs as defect-free ICs when the resemblance is high or the first and second ICs as defective-ICs when the resemblance is low.

10. An apparatus according to claim 9, wherein the first and second ICs are formed on the same semiconductor wafer.

11. An apparatus according to claim 10, wherein the IC comprises a complementary metal oxide semiconductor (CMOS) IC.

12. An apparatus according to claim 9, wherein
one of the first and second ICs is decided as a reference IC;

the second measurement means and the second calculation means operate for another semiconductor IC as the second IC; and the comparison and determination means determines the second IC as a defect-free IC when the resemblance is high, or as a defective IC when the resemblance is low.

13. An apparatus according to claim 9, wherein
the first data calculation means calculates a first average QPSC of the measured QPSCs of the first IC and a first plurality of QPSC deviations of the measured QPSCs of the first IC which are defined as the measured QPSCs of the first IC−minus the first average; and the second data calculation means calculates a second average QPSC of the measured QPSCs of the second IC and second plurality of QPSC deviations of the measured QPSCs of the second IC, which are defined as the measured QPSCs of the second IC−minus the second average;

the apparatus further comprising a third data calculation means for performing a first regression analysis on the first plurality of QPSC deviations and the second plurality of QPSC deviations to produce a first regression line and calculating a gradient of the first regression line, performing a second regression analysis on the measured QPSCs of the first IC to produce a second regression line and calculating a predicted QPSC, and calculating a decision coefficient defined by the following formula:

$$1 - \frac{\sum (\text{measured } QPSCs \text{ of the second } IC - \text{predicted } QPSC)^2}{\sum (\text{second deviation})^2}$$

wherein the comparison and determination means compares the first and second ICs and decides both resemble one another when the decision coefficient is greater than a limit value, and the deviation of the gradient and the ratio is in a predetermined range.

14. An apparatus according to claim 9, wherein
the first data calculation means calculates a first average QPSC of the measured QPSCS of the first IC, a first standard deviation of the measured QPSCs of the first IC, and first normalized values defined as ((the measured QPSCs of the first IC−the first average)/the first standard deviation)T; and the second data calculation means calculates a second average of the measured QPSCs of the second IC, a second standard deviation of the measured QPSCS of the first IC, and second normalized values defined as ((the measured QPSCs of the second IC−the second average)/the second standard deviation);

the apparatus further comprising a third data calculation means for performing a first regression analysis on the first plurality of normalized values and the second plurality of normalized values to produce a first regression line and calculating a gradient of the first regression line, performing a second regression analysis on the first normalized values to produce a second regression line and calculating a predicted normalized value, calculating an average normalized value of the second plurality of normalized values, and calculating a decision coefficient defined by the following formula:

$$1 - \frac{\sum (\text{second standard values} - \text{predicted standard value})^2}{\sum (\text{second standard values} - \text{average standard value})^2}$$

wherein, the comparison and determination means compares the first and second ICs and decides both resemble one another when the decision coefficient is greater than a limit value, and the gradient is in a predetermined range.

15. An apparatus according to claim 9, wherein
the first data calculation means calculates a first average QPSC of the measured QPSCs of the first IC, a first standard deviation of the measured QPSCs of the first IC, and a first feature value defined by (the first average QPSC/the first standard deviation);
the second data calculation means calculates a second average QPSC of the measured QPSCs of the second IC, a second standard deviation of the measured QPSCS of the second IC, and a second feature value defined by (the second average QPSC/the second standard deviation); and
the comparison and determination means compares the first and second ICs and decides both resemble one another when the first and second feature values are in a predetermined range.

16. An apparatus according to claim 9, wherein
the first data calculation means calculates a first average QPSC of the measured QPSCs of the first IC, first QPSC deviations, which are defined as the measured QPSCs of the first IC–minus the first average QPSC, and first feature values defined by (the first QPSC deviations/the first QPSC average);
the second data calculation means calculates a second average QPSC of the measured QPSCs of the second IC, second QPSC deviations, which are defined as the measured QPSCs of the second IC–minus the second average QPSC, and second feature values defined by (the second QPSC deviations/the second QPSC); and
the comparison and determination means compares the first and second ICs and decides both resemble one another when the first and second feature data are in a predetermined range.

17. A method of determining a defect-free or defective semiconductor integrated circuit, comprising:
a first measurement step for measuring a quiescent power supply current (QPSC) of a first semiconductor integrated circuit (IC) a plurality of times in a predetermined interval after operation of the first IC has stopped;
a first data calculation step for calculating a first feature data indicating a feature(s) of the measured QPSCs of the first IC;
a second measurement step for measuring a QPSC of a second semiconductor IC a plurality of times in the same condition as that of the first IC after operation of the second IC has stopped;
a second data calculation step for calculating a second feature data indicating a feature(s) of the measured QPSCs of the second IC; and
a comparison and determination step for comparing a resemblance between the first feature data and the second feature data, and determining the first and second ICs as defect-free ICs when the resemblance is high or the first and second ICs as defective ICs when the resemblance is low; wherein
in the first data calculation step, a first average QPSC of the measured QPSCs of the first IC and a first plurality of QPSC deviations of the measured QPSCs of the first IC, which are the measured QPSCs of the first IC minus the first average, are calculated;
in the second data calculation step, a second average QPSC of the measured QPSCs of the second IC and a second plurality of QPSC deviations of the measured QPSCs of the second IC, which are the measured QPSCs of the second IC minus the second average, are calculated; and
the method further comprising a third data calculation step for performing a first regression analysis on the first plurality of QPSC deviations and the second plurality of QPSC deviations to produce a first regression line and calculating a gradient of the first regression line, performing a second regression analysis on the measured QPSCs of the first IC to produce a second regression line and calculating a predicted QPSC, and calculating a decision coefficient defined by the following formula:

$$1 - \frac{\sum (\text{measured } QPSCs \text{ of the second } IC - \text{predicted } QPSC)^2}{\sum (\text{second deviation})^2}$$

wherein, in the comparison and determination step, the first and second ICs resemble one another when the decision coefficient is greater than a limit value, and the deviation of the gradient and the ratio is in a predetermined range.

18. A method of determining a defect-free or defective semiconductor integrated circuit, comprising:
a first measurement step for measuring a quiescent power supply current (QPSC) of a first semiconductor integrated circuit (IC) a plurality of times in a predetermined interval after operation of the first IC has stopped;
a first data calculation step for calculating a first feature data indicating a feature(s) of the measured QPSCs of the first IC;
a second measurement step for measuring a QPSC of a second semiconductor IC a plurality of times in the same condition as that of the first IC after operation of the second IC has stopped;
a second data calculation step for calculating a second feature data indicating a feature(s) of the measured QPSCs of the second IC; and
a comparison and determination step for comparing a resemblance between the first feature data and the second feature data, and determining the first and second ICs as defect-free ICs when the resemblance is high or the first and second ICs as defective ICs when the resemblance is low; wherein
in the first data calculation step, a first average QPSC of the measured QPSCs of the first IC, a first standard deviation of the measured QPSCs of the first IC, and first normalized values defined as ((the measured QPSCs of the first IC-the first average)/the first standard deviation) are calculated; and
in the second data calculation step, a second average of the measured QPSCs of the second IC, a second standard deviation of the measured QPSCs of the first IC, and second normalized values defined as ((the measured QPSCs of the second IC-the second average)/the second standard deviation) are calculated;

the method further comprising a third data calculation step for performing a first regression analysis on the first plurality of normalized values and the second plurality of normalized values to produce a first regression line and calculating a gradient of the first regression line, performing a second regression analysis on the first normalized values to produce a second regression line and calculating a predicted normalized value, calculating an average normalized value of the second plurality of normalized values, and calculating a decision coefficient defined by the following formula:

$$1 - \frac{\sum (\text{second standard values} - \text{predicted standard value})^2}{\sum (\text{second standard values} - \text{average standard value})^2}$$

wherein, in the comparison and determination step, the first and second ICs resemble one another when the decision coefficient is greater than a limit value, and the gradient is in a predetermined range.

19. A method of determining a defect-free or defective semiconductor integrated circuit, comprising:

a first measurement step for measuring a quiescent power supply current (QPSC) of a first semiconductor integrated circuit (IC) a plurality of times in a predetermined interval after operation of the first IC has stopped;

a first data calculation step for calculating a first feature data indicating a feature(s) of the measured QPSCs of the first IC;

a second measurement step for measuring a QPSC of a second semiconductor IC a plurality of times in the same condition as that of the first IC after operation of the second IC has stopped;

a second data calculation step for calculating a second feature data indicating a feature(s) of the measured QPSCs of the second IC; and a comparison and determination step for comparing a resemblance between the first feature data and the second feature data, and determining the first and second ICs as defect-free ICs when the resemblance is high or the first and second ICs as defective ICs when the resemblance is low; wherein in the first data calculation step, a first average QPSC of the measured QPSCs of the first IC, a first standard deviation of the measured QPSCs of the first IC, and a first feature value defined by (the first average QPSC/the first standard deviation) are calculated;

in the second data calculation step, a second average QPSC of the measured QPSCs of the second IC, a second standard deviation of the measured QPSCs of the second IC, and a second feature value defined by (the second average QPSC/the second standard deviation) are calculated;

and in the comparison and determination step, the first and second ICs resemble one another when the first and second feature values are in a predetermined range.

20. A method of determining a defect-free or defective semiconductor integrated circuit, comprising:

a first measurement step for measuring a quiescent power supply current (QPSC) of a first semiconductor integrated circuit (IC) a plurality of times in a predetermined interval after operation of the first IC has stopped;

a first data calculation step for calculating a first feature data indicating a feature(s) of the measured QPSCs of the first IC;

a second measurement step for measuring a QPSC of a second semiconductor IC a plurality of times in the same condition as that of the first IC after operation of the second IC has stopped;

a second data calculation step for calculating a second feature data indicating a feature(s) of the measured QPSCs of the second IC; and a comparison and determination step for comparing a resemblance between the first feature data and the second feature data, and determining the first and second ICs as defect-free ICs when the resemblance is high or the first and second ICs as defective ICs when the resemblance is low; wherein in the first data calculation step, a first average QPSC of the measured QPSCs of the first IC, first QPSC deviations, which are defined as the measured QPSCs of the first IC minus the first average QPSC, and first feature values defined by (the first QPSC deviations/the first QPSC average) are calculated;

in the second data calculation step, a second average QPSC of the measured QPSCs of the second IC, second QPSC deviations, which are defined as the measured QPSCs of the second IC minus the second average QPSC, and second feature values defined by (the second QPSC deviations/the second QPSC) are calculated; and in the comparison and determination step, the first and second ICs resemble one another when the first and second feature data are in a predetermined range.

21. A method according to any one of claims 17, 18, 19 or 20 wherein the first and second ICs are formed on the same semiconductor wafer.

22. A method according to claim 21, wherein the IC comprises a complementary metal oxide semiconductor (CMOS) IC.

23. A method according to any one of claims 17, 18, 19 or 20, wherein one of the first and second ICs is decided as a reference IC;

the second measurement step and the second calculation step are carried out for another semiconductor IC as the second IC; and in the comparison and determination step, the second IC is determined as a defect-free IC when the resemblance is high, or as a defective IC when the resemblance is low.

24. An apparatus for determining a defect-free or defective semiconductor integrated circuit, comprising:

a first measurement means for measuring a quiescent power supply current (QPSC) of a first semiconductor integrated circuit (IC) a plurality of times in a predetermined interval after operation of the first IC has stopped;

a first data calculation means for calculating a first feature data indicating a feature(s) of the measured QPSCs of the first IC;

a second measurement means for measuring a QPSC of a second semiconductor IC a plurality of times in the same condition as that of the first IC after operation of the second IC has stopped;

a second data calculation means for calculating a second feature data indicating a feature(s) of the measured QPSCs of the second IC; and a comparison and determination means for comparing a resemblance between the first feature data and the second feature data, and determining the first and second ICs as defect-free ICs when the resemblance is high or the first and second ICs as defective ICs when the resemblance is low; wherein the first data calculation means calculates a first average QPSC of the measured QPSCs of the first IC and a first plurality of QPSC deviations of the measured QPSCs of the first IC which are defined as the measured QPSCs of the first IC minus the first average; and the second data calculation means calculates a second average QPSC of the measured QPSCs of the second IC and second plurality of QPSC deviations of the measured QPSCs of the second IC, which are defined as the measured QPSCs of the second IC minus the second average;

the apparatus further comprising a third data calculation means for performing a first regression analysis on the first plurality of QPSC deviations and the second plurality of QPSC deviations to produce a first regression line and calculating a gradient of the first regression line, performing a second regression analysis on the measured QPSCs of the first IC to produce a second regression line and calculating a predicted QPSC, and calculating a decision coefficient defined by the following formula:

$$1 - \frac{\sum (\text{measured } QPSCs \text{ of the second } IC - \text{predicted } QPSC)^2}{\sum (\text{second deviation})^2}$$

wherein the comparison and determination means compares the first and second ICs and decides both resemble one another when the decision coefficient is greater than a limit value, and the deviation of the gradient and the ratio is in a predetermined range.

25. An apparatus for determining a defect-free or defective semiconductor integrated circuit, comprising:

a first measurement means for measuring a quiescent power supply current (QPSC) of a first semiconductor integrated circuit (IC) a plurality of times in a predetermined interval after operation of the first IC has stopped;

a first data calculation means for calculating a first feature data indicating a feature(s) of the measured QPSCs of the first IC;

a second measurement means for measuring a QPSC of a second semiconductor IC a plurality of times in the same condition as that of the first IC after operation of the second IC has stopped;

a second data calculation means for calculating a second feature data indicating a feature(s) of the measured QPSCs of the second IC; and a comparison and determination means for comparing a resemblance between the first feature data and the second feature data, and determining the first and second ICs as defect-free ICs when the resemblance is high or the first and second ICs as defective ICs when the resemblance is low; wherein the first data calculation means calculates a first average QPSC of the measured QPSCs of the first IC, a first standard deviation of the measured QPSCs of the first IC, and first normalized values defined as ((the measured QPSCs of the first IC-the first average)/the first standard deviation); and the second data calculation means calculates a second average of the measured QPSCs of the second IC, a second standard deviation of the measured QPSCs of the first IC, and second normalized values defined as ((the measured QPSCs of the second IC-the second average)/the second standard deviation);

the apparatus further comprising a third data calculation means for performing a first regression analysis on the first plurality of normalized values and the second plurality of normalized values to produce a first regression line and calculating a gradient of the first regression line, performing a second regression analysis on the first normalized values to produce a second regression line and calculating a predicted normalized value, calculating an average normalized value of the second plurality of normalized values, and calculating a decision coefficient defined by the following formula:

$$1 - \frac{\sum (\text{second standard values} - \text{predicted standard value})^2}{\sum (\text{second standard values} - \text{average standard value})^2}$$

wherein the comparison and determination means compares the first and second ICs and decides both resemble one another when the decision coefficient is greater than a limit value, and the gradient is in a predetermined range.

26. An apparatus for determining a defect-free or defective semiconductor integrated circuit, comprising:

a first measurement means for measuring a quiescent power supply current (QPSC) of a first semiconductor integrated circuit (IC) a plurality of times in a predetermined interval after operation of the first IC has stopped;

a first data calculation means for calculating a first feature data indicating a feature(s) of the measured QPSCs of the first IC;

a second measurement means for measuring a QPSC of a second semiconductor IC a plurality of times in the same condition as that of the first IC after operation of the second IC has stopped;

a second data calculation means for calculating a second feature data indicating a feature(s) of the measured QPSCS of the second IC; and a comparison and determination means for comparing a resemblance between the first feature data and the second feature data, and determining the first and second ICs as defect-free ICs when the resemblance is high or the first and second ICs as defective ICs when the resemblance is low; wherein the first data calculation means calculates a first average QPSC of the measured QPSCs of the first IC, a first standard deviation of the measured QPSCs of the first IC, and a first feature value defined by (the first average QPSC/the first standard deviation);

the second data calculation means calculates a second average QPSC of the measured QPSCs of the second IC, a second standard deviation of the measured QPSCs of the second IC, and a second feature value defined by (the second average QPSC/the second standard deviation); and the comparison and determination means compares the first and second ICs and decides both resemble one another when the first and second feature values are in a predetermined range.

27. An apparatus for determining a defect-free or defective semiconductor integrated circuit, comprising:

a first measurement means for measuring a quiescent power supply current (QPSC) of a first semiconductor integrated circuit (IC) a plurality of times in a predetermined interval after operation of the first IC has stopped;

a first data calculation means for calculating a first feature data indicating a feature(s) of the measured QPSCs of the first IC;

a second measurement means for measuring a QPSC of a second semiconductor IC a plurality of times in the same condition as that of the first IC after operation of the second IC has stopped;

a second data calculation means for calculating a second feature data indicating a feature(s) of the measured QPSCs of the second IC; and a comparison and determination means for comparing a resemblance between the first feature data and the second feature data, and determining the first and second ICs as defect-free ICs when the resemblance is high or the first and second ICs as defective ICs when the resemblance is low; wherein the first data calculation means calculates a first average QPSC of the measured QPSCs of the first IC, first QPSC deviations, which are defined as (the measured QPSCs of the first IC-the first average QPSC), and first feature values defined by (the first QPSC deviations/the first QPSC average);

the second data calculation means calculates a second average QPSC of the measured QPSCs of the second IC, second QPSC deviations, which are defined as the measured QPSCs of the second IC minus the second average QPSC, and second feature values defined by (the second QPSC deviations/the second QPSC); and the comparison and determination means compares the first and second ICs and decides both resemble one another when the first and second feature data are in a predetermined range.

28. An apparatus according to any one of claims 24, 33, 34 or 35, wherein the first and second ICs are formed on the same semiconductor wafer.

29. An apparatus according to claim 28, wherein the IC comprises a complementary metal oxide semiconductor (CMOS) IC.

30. An apparatus according to any one of claims 24, 25, 26 or 27, wherein one of the first and second ICs is decided as a reference IC;

the second measurement means and the second calculation means operate for another semiconductor IC as the second IC; and the comparison and determination means determines the second IC as a defect-free IC when the resemblance is high, or as a defective IC when the resemblance is low.

* * * * *

UNITED STATES PATENT AND TRADEMARK OFFICE
CERTIFICATE OF CORRECTION

PATENT NO. : 6,889,164 B2
APPLICATION NO. : 09/964540
DATED : May 3, 2005
INVENTOR(S) : Yukio Okuda Page 1 of 1

It is certified that error appears in the above-identified patent and that said Letters Patent is hereby corrected as shown below:

Column 28:
Line 49, "deviation)T;" should read -- deviation); --.

Signed and Sealed this

Twenty-sixth Day of December, 2006

JON W. DUDAS
*Director of the United States Patent and Trademark Office*